(12) United States Patent
Chen et al.

(10) Patent No.: US 10,680,097 B2
(45) Date of Patent: Jun. 9, 2020

(54) MOSFET DEVICE AND FABRICATION

(71) Applicant: Alpha and Omega Semiconductor Incorporated, Sunnyvale, CA (US)

(72) Inventors: John Chen, Palo Alto, CA (US); Il Kwan Lee, San Ramon, CA (US); Hong Chang, Cupertino, CA (US); Wenjun Li, Shanghai (CN); Anup Bhalla, Santa Clara, CA (US); Hamza Yilmaz, Saratoga, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 133 days.

(21) Appl. No.: 15/699,966

(22) Filed: Sep. 8, 2017

(65) Prior Publication Data
US 2017/0373186 A1  Dec. 28, 2017

Related U.S. Application Data

(63) Continuation of application No. 14/033,692, filed on Sep. 23, 2013, now Pat. No. 9,793,393, which is a continuation of application No. 13/456,406, filed on Apr. 26, 2012, now Pat. No. 8,564,055, which is a continuation of application No. 12/583,191, filed on Aug. 14, 2009, now Pat. No. 8,193,580.

(51) Int. Cl.
*H01L 29/78* (2006.01)
*H01L 29/423* (2006.01)
*H01L 29/66* (2006.01)
*H01L 29/40* (2006.01)
*H01L 29/417* (2006.01)

(52) U.S. Cl.
CPC ........ *H01L 29/7813* (2013.01); *H01L 29/407* (2013.01); *H01L 29/42368* (2013.01); *H01L 29/42372* (2013.01); *H01L 29/66719* (2013.01); *H01L 29/66727* (2013.01); *H01L 29/66734* (2013.01); *H01L 29/7811* (2013.01); *H01L 29/41766* (2013.01); *H01L 29/4238* (2013.01)

(58) Field of Classification Search
None
See application file for complete search history.

(56) References Cited

U.S. PATENT DOCUMENTS

| | | |
|---|---|---|
| 5,434,435 A | 7/1995 | Baliga |
| 5,998,833 A | 12/1999 | Baliga |
| 6,690,062 B2 | 2/2004 | Henninger |
| 6,750,116 B1 | 6/2004 | Chen |
| 6,893,917 B2 | 5/2005 | Hsieh |
| 7,449,354 B2 | 11/2008 | Marchant |
| 7,470,588 B2 | 12/2008 | Cho |

(Continued)

Primary Examiner — Robert K Carpenter
(74) Attorney, Agent, or Firm — Van Pelt, Yi & James LLP

(57) ABSTRACT

A semiconductor device, comprising: a substrate; an active gate trench in the substrate; a source polysilicon pickup trench in the substrate; a polysilicon electrode disposed in the source polysilicon pickup trench; a gate pickup trench in the substrate; a first conductive region and a second conductive region disposed in the gate pickup trench, the first conductive region and the second conductive region being separated by oxide, wherein at least a portion of the oxide surrounding the first conductive region in the gate pickup trench is thicker than at least a portion of the oxide under the second conductive region; and a body region in the substrate.

7 Claims, 39 Drawing Sheets

(56) References Cited

U.S. PATENT DOCUMENTS

| | | |
|---|---|---|
| 7,473,603 B2 | 1/2009 | Kraft |
| 7,553,740 B2 | 6/2009 | Sharp |
| 7,576,388 B1 | 8/2009 | Wilson |
| 7,936,009 B2 | 5/2011 | Pan |
| 2004/0021174 A1 | 2/2004 | Kobayashi |
| 2004/0041207 A1 | 3/2004 | Takano |
| 2004/0065919 A1 | 4/2004 | Wilson |
| 2004/0169220 A1 | 9/2004 | Takemori |
| 2005/0285175 A1 | 12/2005 | Cheng |
| 2006/0046397 A1 | 3/2006 | Chang |
| 2006/0081918 A1 | 4/2006 | Hsu |
| 2006/0145247 A1 | 7/2006 | Zundel |
| 2006/0209887 A1 | 9/2006 | Bhalla |
| 2006/0273382 A1 | 12/2006 | Hshieh |
| 2006/0281249 A1 | 12/2006 | Yilmaz |
| 2007/0155104 A1 | 7/2007 | Marchant |
| 2007/0158701 A1 | 7/2007 | Chang |
| 2007/0187751 A1 | 8/2007 | Hu |
| 2007/0194374 A1 | 8/2007 | Bhalla |
| 2008/0067584 A1 | 3/2008 | Lui |
| 2008/0121986 A1 | 5/2008 | Hshieh |
| 2008/0135931 A1 | 6/2008 | Challa |
| 2008/0258213 A1 | 10/2008 | Yilmaz |
| 2008/0265289 A1 | 10/2008 | Bhalla |
| 2009/0014768 A1 | 1/2009 | Lin |
| 2009/0053869 A1 | 2/2009 | Hirler |
| 2009/0072301 A1 | 3/2009 | Bhalla |
| 2009/0085074 A1 | 4/2009 | Su |
| 2009/0090967 A1* | 4/2009 | Chen ............ H01L 29/0634 257/330 |
| 2009/0111231 A1 | 4/2009 | Grebs |
| 2009/0114968 A1 | 5/2009 | Wang |
| 2010/0006928 A1 | 1/2010 | Pan |
| 2010/0052044 A1 | 3/2010 | Hirler |
| 2010/0065904 A1 | 3/2010 | Pan |
| 2010/0127324 A1 | 5/2010 | Hsieh |

\* cited by examiner

US 10,680,097 B2

MOSFET DEVICE AND FABRICATION

CROSS REFERENCE TO OTHER APPLICATIONS

This application is a continuation of co-pending U.S. patent application Ser. No. 14/033,692, entitled MOSFET DEVICE AND FABRICATION filed Sep. 23, 2013 which is incorporated herein by reference for all purposes, which is a continuation of U.S. patent application Ser. No. 13/456,406, now U.S. Pat. No. 8,564,055, entitled SHIELDED GATE TRENCH MOSFET DEVICE AND FABRICATION filed Apr. 26, 2012, which is incorporated herein by reference in its entirety for all purposes, which is a continuation of U.S. patent application Ser. No. 12/583,191, now U.S. Pat. No. 8,193,580, entitled SHIELDED GATE TRENCH MOSFET DEVICE AND FABRICATION filed Aug. 14, 2009, which is incorporated herein by reference in its entirety for all purposes.

BACKGROUND OF THE INVENTION

Many electronic circuit designs today have strict requirements on device performance parameters such as switching performance and on-state resistance. Power MOS devices are often used in such circuits. Shielded gate trench Metal Oxide Semiconductor Field Effect Transistors (MOSFETs) is a type of power MOS device that has good high frequency switching performance and low on-state resistance. Existing fabrication techniques for shielded gate MOSFETs are typically complex and expensive, usually requiring 6 or more masks to be applied during processing.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Embodiments of shielded gate MOSFET devices and fabrication process are disclosed. The fabrication process employs a self aligned contact scheme and requires only four masks. The resulting shielded gate MOSFET devices are less expensive to produce and have improved device characteristics, such as higher breakdown voltage.

Figure 1A:
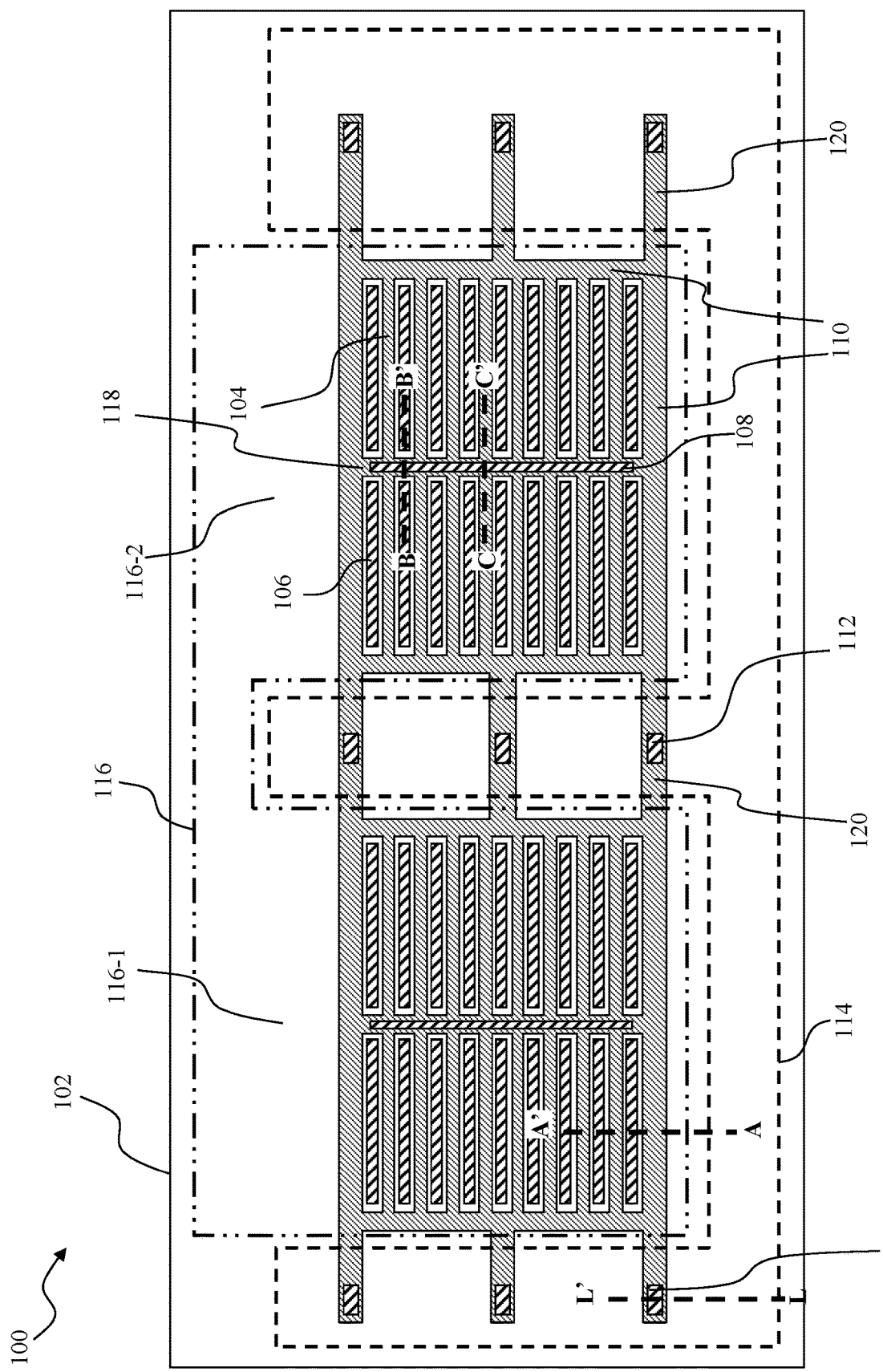
FIG. 1A is a diagram illustrating a top view of an embodiment of a shielded gate MOSFET structure.

FIG. 1A is a diagram illustrating a top view of an embodiment of a shielded gate MOSFET structure. In this example, structure 100 is built on a semiconductor substrate 102. Active regions of the structure include active gate trenches such as 104, in which gates are formed. The active regions further include source/body contact openings such as 106, in which contacts are formed to electrically connect source regions and body regions to the source metal 116. The active regions also include source polysilicon (poly) pickup contacts such as 108. In a source poly pickup contact, poly source electrode is disposed in the source pickup trench 118 and is electrically connected through source pickup contact opening 108 to source metal 116, which in turn is electrically connected to the source and body regions of the device. The active regions are surrounded by trenches such as 110, which serve several purposes, including as termination trenches that separate high potential areas (such as the drain) from low potential areas (such as the source), and as gate runners configured to form electrical connections with the gate electrodes in active gate trenches. As shown in FIG. 1A, termination/gate runner trenches 110 are mostly covered by source metal 116, which, as will be shown in the cross sectional views below, is insulated from the gate electrodes in trenches 104 and 110 by a dielectric layer. Termination/gate runner trenches 110 further include portions that form gate runner extension trenches 120. The gate runner extension trenches extend into gate metal area 114 and serve as gate pickup trenches where gate pickup contact openings 112 are disposed for electrically connecting gate runner to gate metal 114. The gate runner extension trenches 120 further interconnect the gate runners in different areas such as 116-1 and 116-2. In the example shown, the gate runner/termination trenches 110 and source poly pickup trenches 118 are wider than the active gate trenches 104.

Figure 1B:
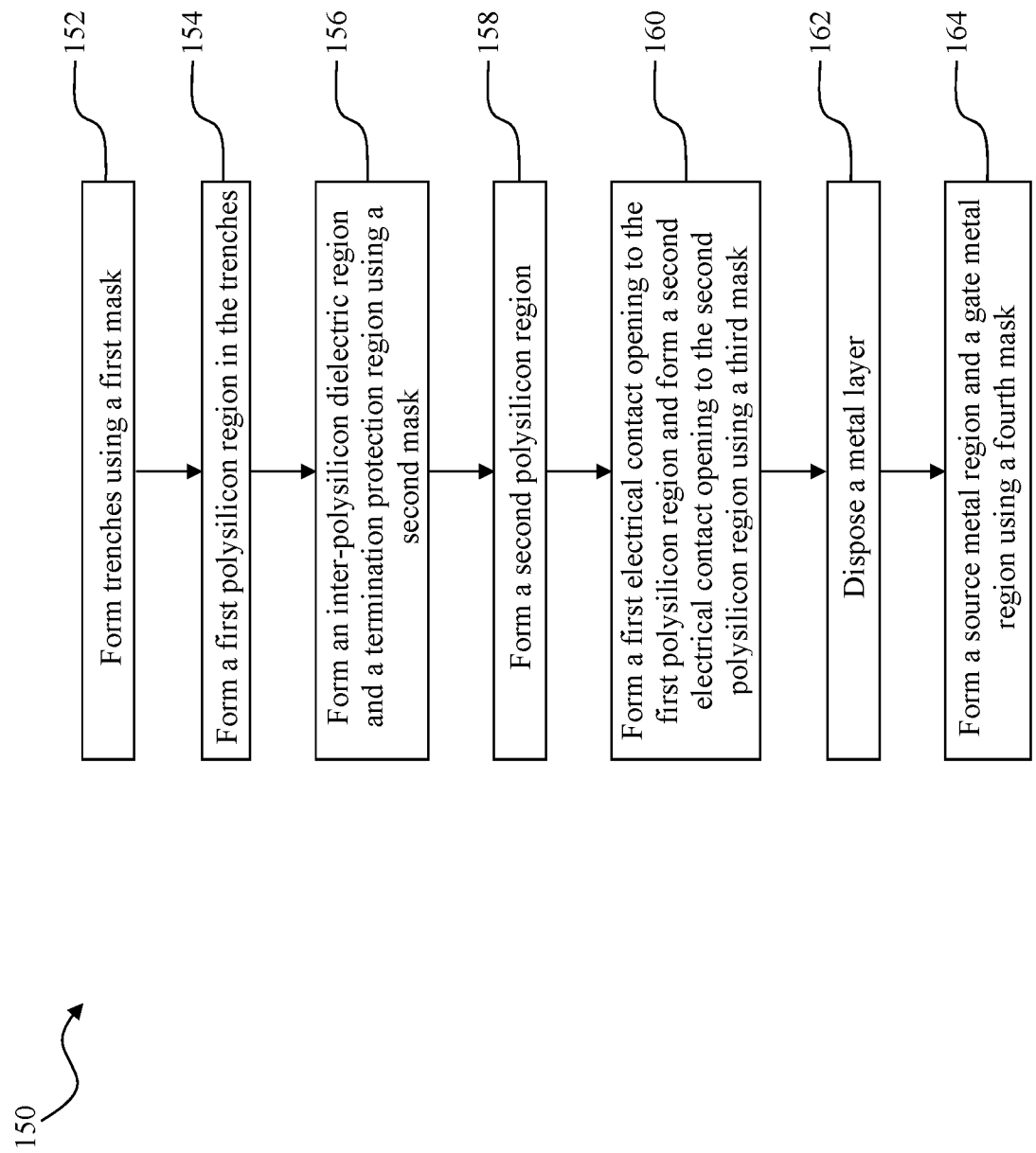
FIG. 1B is a flowchart illustrating an embodiment of a process for fabricating a shielded gate MOSFET such as 100.

FIG. 1B is a flowchart illustrating an embodiment of a process for fabricating a shielded gate MOSFET such as 100. Process 150 involves four masks. At 152, a number of trenches are formed using a first mask. At 154, a first set of polysilicon regions, also referred to as source poly, shield poly, or poly 1, are formed in the plurality of trenches. At 156, one or more inter-polysilicon dielectric regions and one or more termination protection regions are formed using a second mask. At 158, polysilicon is disposed in some of the trenches to form a second set of polysilicon regions, also referred to as gate poly or poly 2. At 160, using a third mask, a first electrical contact opening is made to a gate poly, and a second electrical contact opening is made to a source poly. At 162, a metal layer is disposed. At 164, a source metal region and a gate metal region are formed using a fourth mask.

Figure 4:
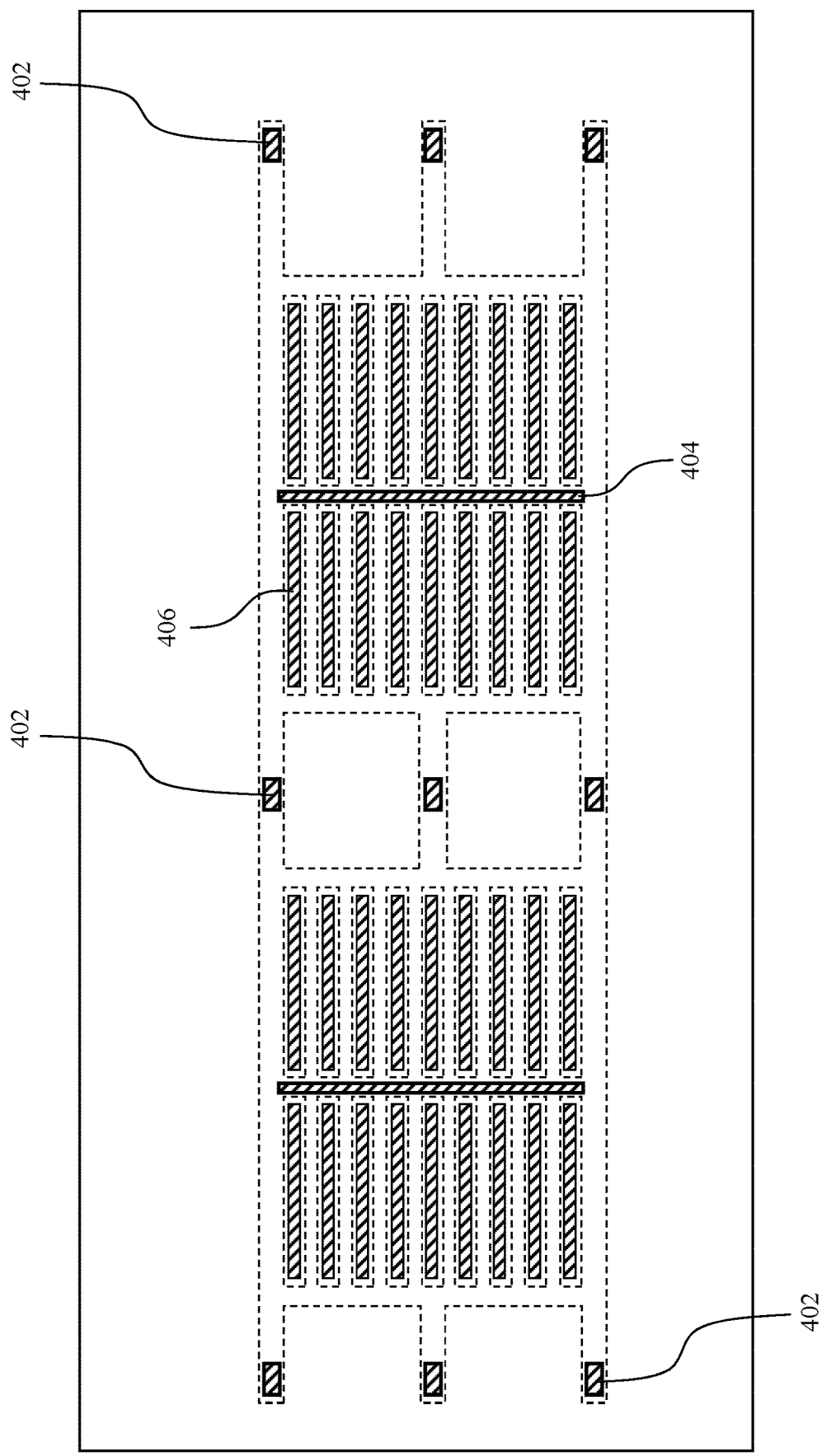
FIG. 4 is a diagram illustrating an example of a third mask used in an embodiment of a device fabrication process.
Figure 5:
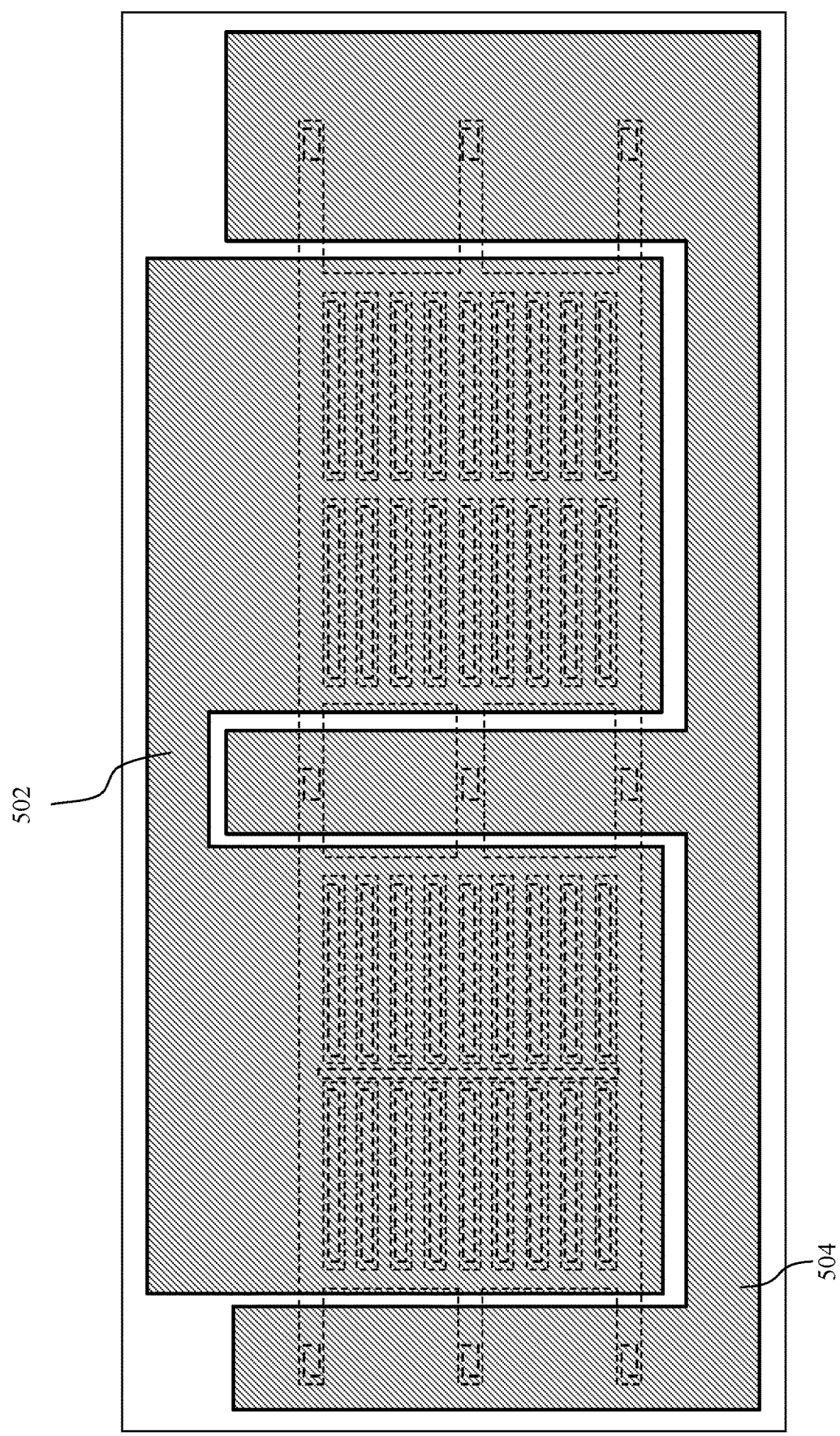
FIG. 5 is a diagram illustrating an example of a fourth mask used in an embodiment of a device fabrication process.
Figure 6A:
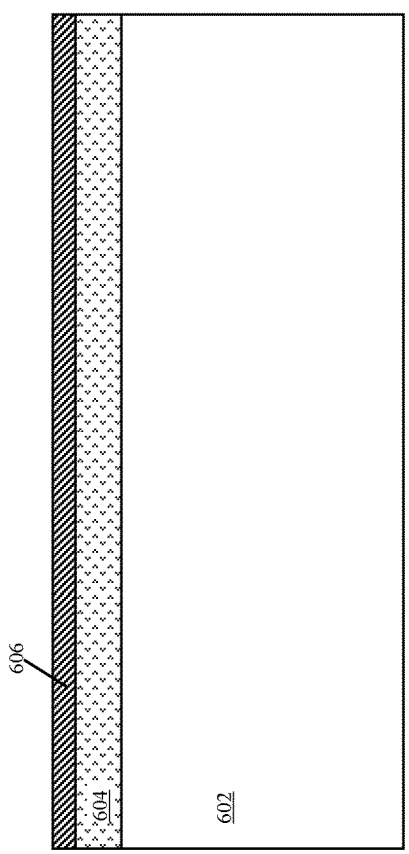
FIGS. 6AA'-32AA' are cross sectional diagrams illustrating the AA' region of structure 100 during the fabrication process.
Figure 6B:
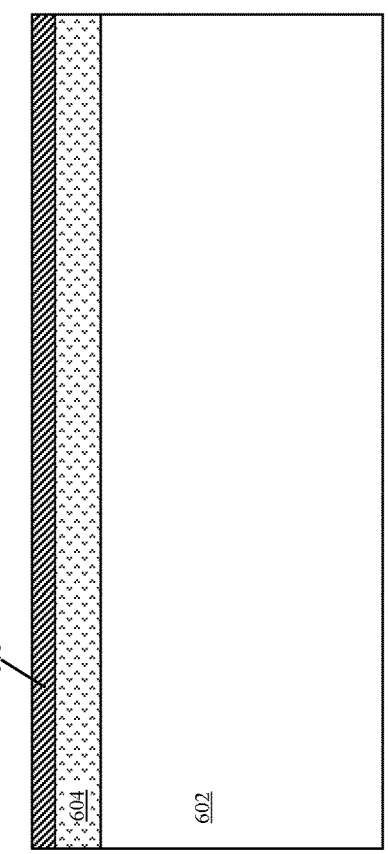
FIGS. 6BB'-32BB' are cross sectional diagrams illustrating the BB' region of structure 100 during the fabrication process.
Figure 6L:
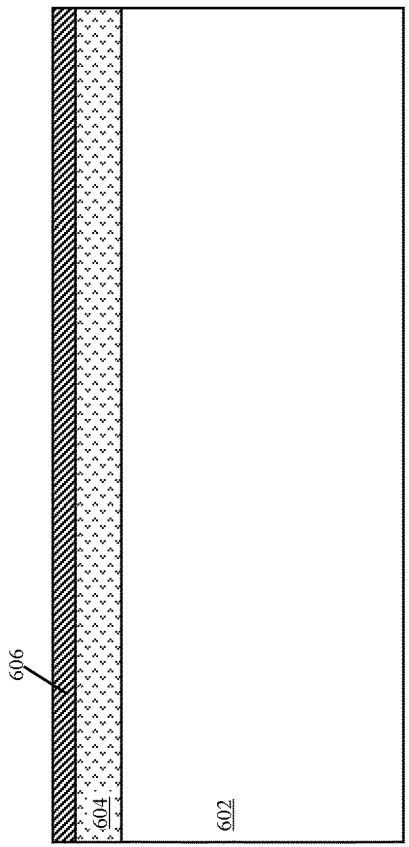
FIGS. 6LL'-32LL' are cross sectional diagrams illustrating the LL' region of structure 100 during the fabrication process.
Figure 6C:
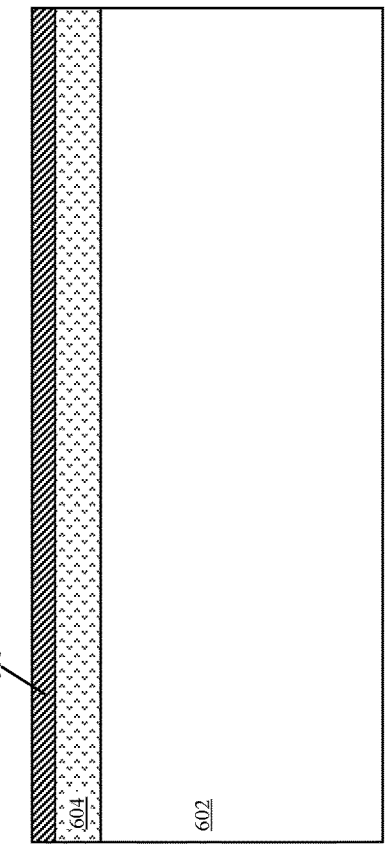
FIGS. 6CC'-32CC' are cross sectional diagrams illustrating the CC' region of structure 100 during the fabrication process.
Figure 32A:
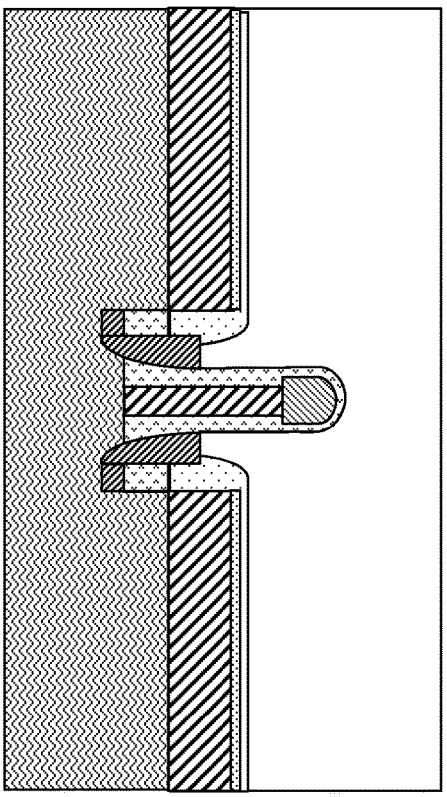
Figure 32B:
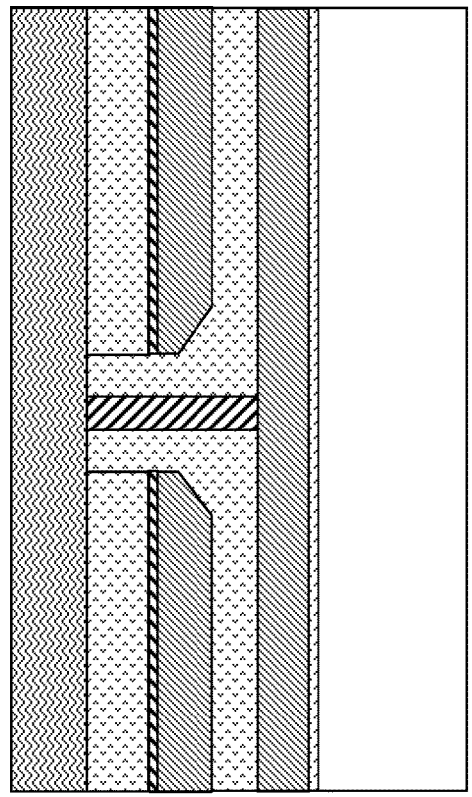
Figure 32L:
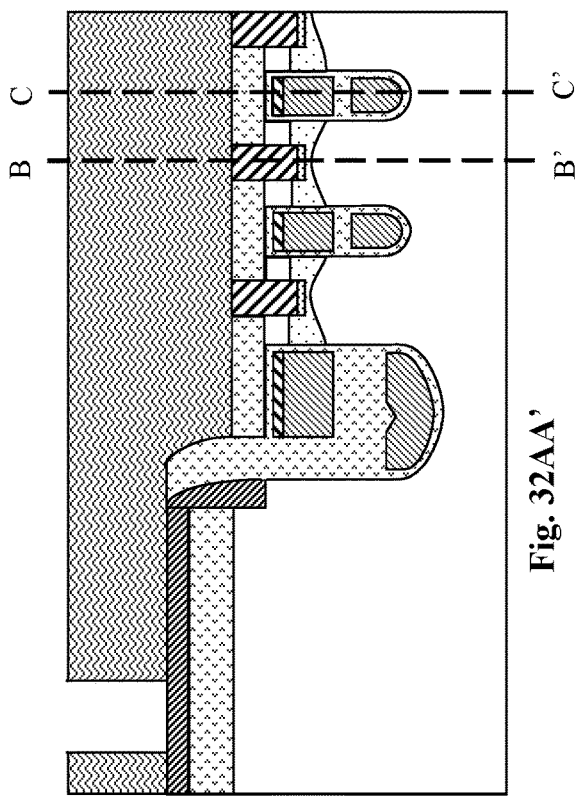
Figure 32C:
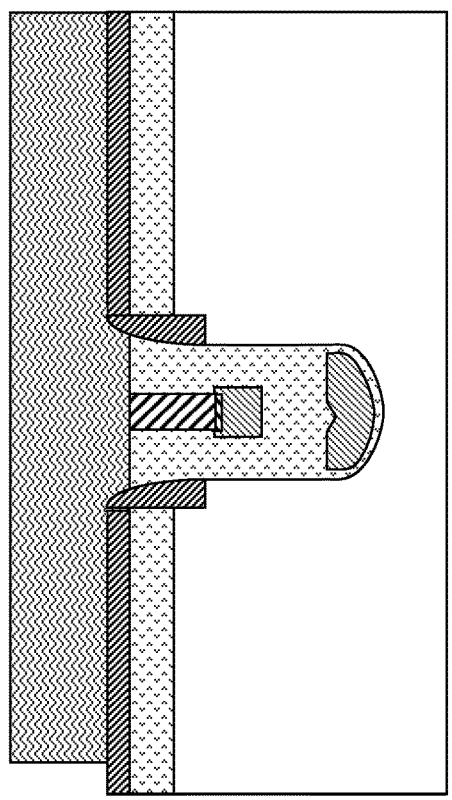

Fabrication process 150 is discussed in greater detail below in connection with FIGS. 2-5, which illustrate the top views of four masks used in the processes, and FIGS. 6AA'-32AA', 6BB'-32BB', 6CC'-32CC', and 6LL'-32LL', which respectively illustrate cross sectional views along AA', BB', CC', and LL' of FIG. 1A. AA' extends across active gate trenches and source/body contacts in an active region, as well as a termination/gate runner trench that terminates the active region and surrounds the active area. BB' extends along a set of source/body contacts, and intersects a source poly pickup contact trench that lies between the source/body contacts. CC' extends along a set of active gate trenches, and intersects a source poly pickup contact trench that lies between the set of active gate trenches. LL' extends through a termination region, and intersects a gate pick up trench (which, in this case, is an extension of the termination/gate runner trench) as well as a gate pickup contact. The cross sectional diagrams of the device are illustrated in FIGS. 32AA', 32BB', 32CC', and 32LL' and are discussed in greater detail in connection with these figures.

In the following discussion, an N type device is described for purposes of illustration. P type devices may be fabricated using a similar process. In FIGS. 6AA', 6BB', 6CC', and 6LL', an N type substrate 602 (i.e., an N$^+$ silicon wafer with an N$^-$ epi layer grown on it) is used as the drain of the device. In some embodiments, Epi doping concentration is approximately 3E16-1E17 dopants/cm$^3$, with thickness of 2-4 um, and substrate resistivity of 0.5-3 mohm*cm.

A silicon oxide layer 604 is formed on the substrate by deposition or thermal oxidation. A nitride layer 606 is disposed on top of the silicon oxide layer. In some embodiments, the thickness of the silicon oxide layer is approximately 500~1500 Å, and the thickness of the nitride layer is approximately 1500 Å.

Figure 2:
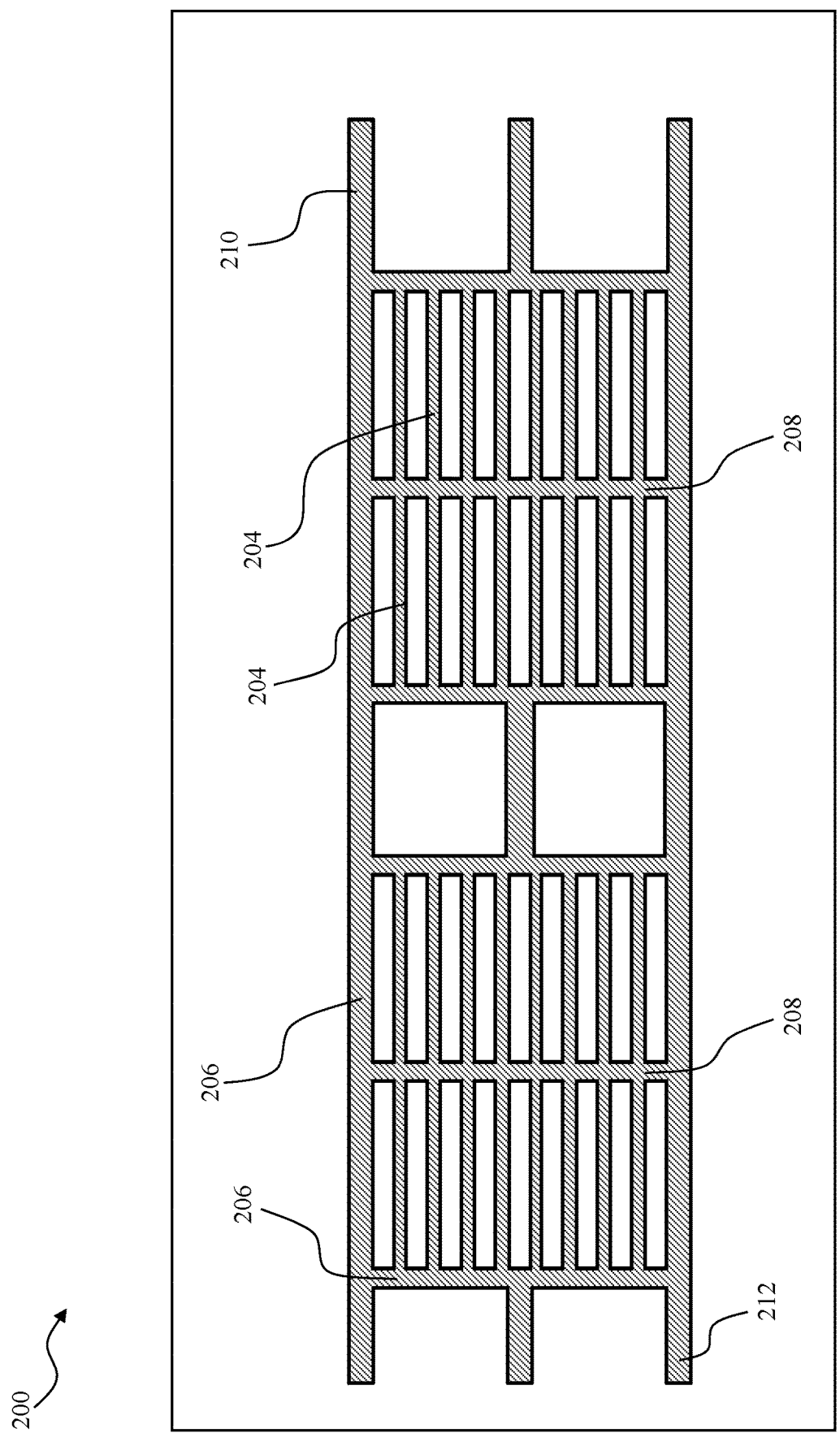
FIG. 2 is a diagram illustrating an example of a first mask used in an embodiment of a device fabrication process.

A photo resist (PR) layer is then applied on top of the nitride layer and patterned using a first mask. FIG. 2 is a diagram illustrating the top view of an example of a first mask, also referred to as the trench mask. Trench mask 200 is used to pattern the PR layer. The PR areas corresponding to the shaded areas of the mask are not exposed, and the PR areas corresponding to the un-shaded areas of the mask are exposed. In the following discussion, for purposes of illustration, it is assumed that positive PR is used, thus the unexposed areas are kept and the exposed areas are removed. Negative PR may also be used, and the mask would be modified accordingly. The trench mask defines active gate trenches 204, source poly pickup trenches such as 208, and gate runner/termination trenches such as 210. In the example shown, different types of trenches have different width: the active gate trenches are the narrowest, the source poly pickup trenches are medium width, and the gate runner/termination trenches are the widest. In some embodiments, the widths of the active gate trenches, the source poly pickup trenches, and the gate runner/termination trenches are approximately 0.6 um, 1.0 um, and 2.0 um, respectively. Low grade masks such as masks with critical dimension of 0.35 um can be used to fabricate the device therefore reduce the cost of masks required.

Figure 7A:
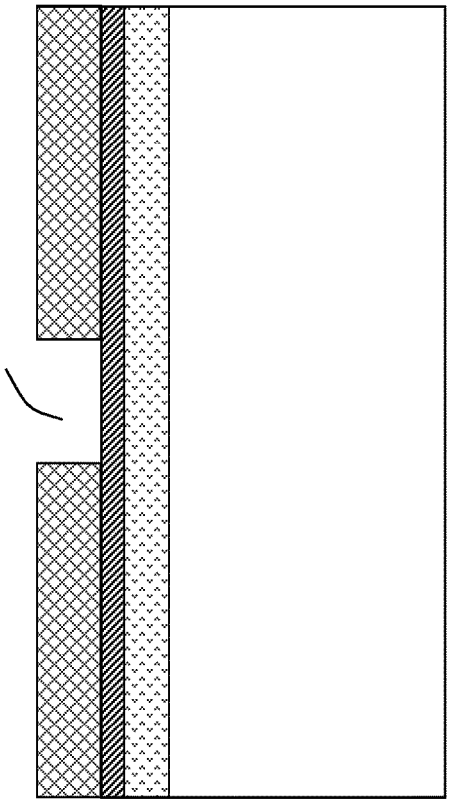
Figure 7B:
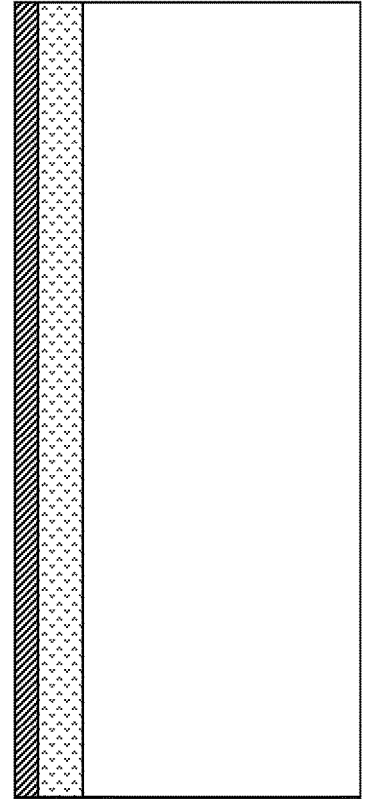
Figure 7L:
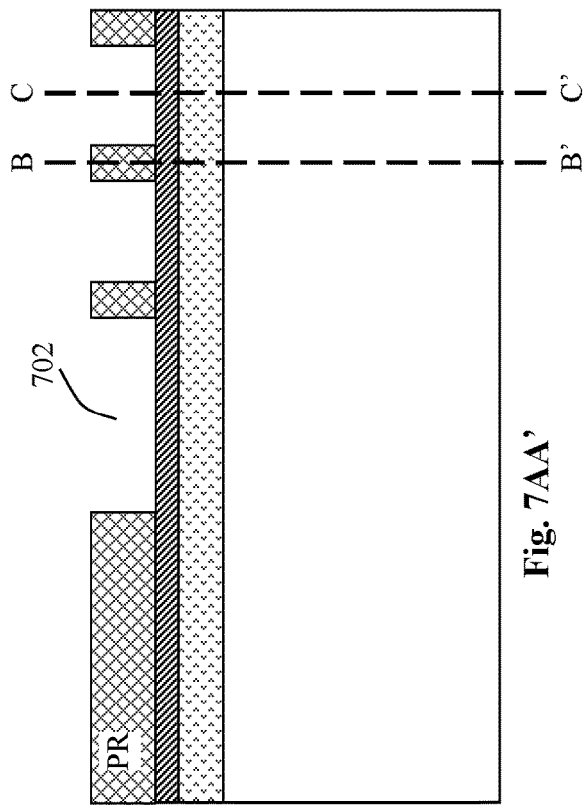
Figure 7C:
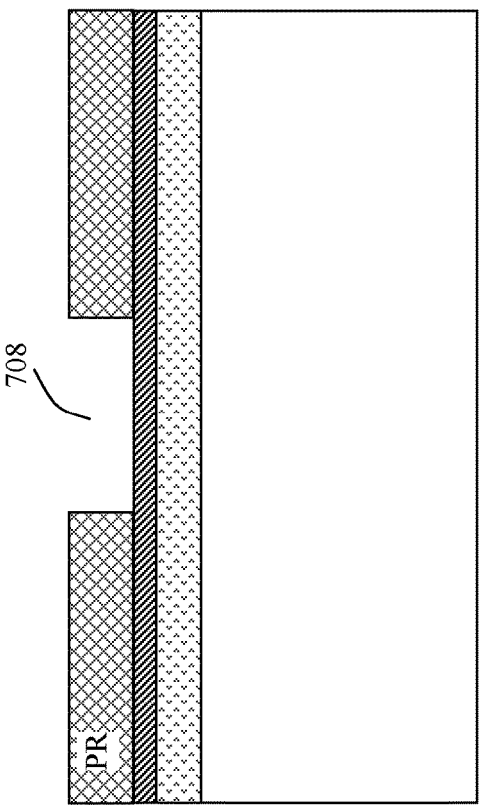

In FIG. 7AA', in the AA' cross section, the residual PR layer forms termination trench opening 702 and active gate trench openings 704. In FIG. 7BB', in the BB' cross section, the residual PR layer forms source poly pickup contact opening 706. In FIG. 7CC', in the CC' cross section, all the PR layer is removed. In FIG. 7LL', in the LL' cross section, the residual PR layer forms gate pickup contact opening 708.

Figure 8A:
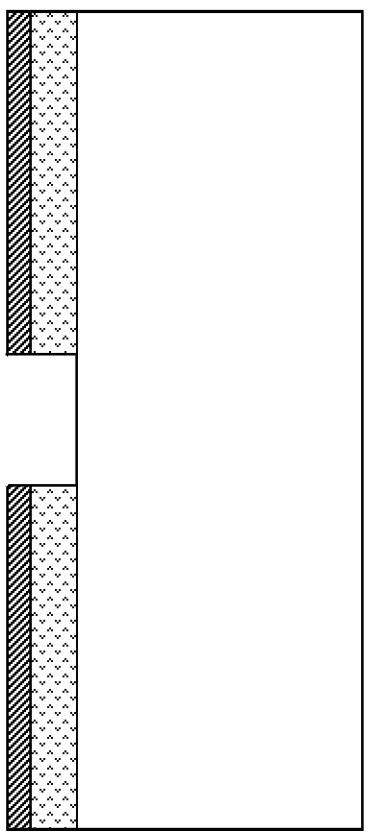
Figure 8B:
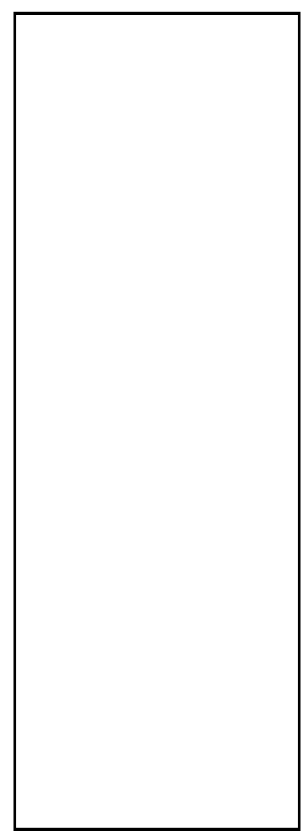
Figure 8L:
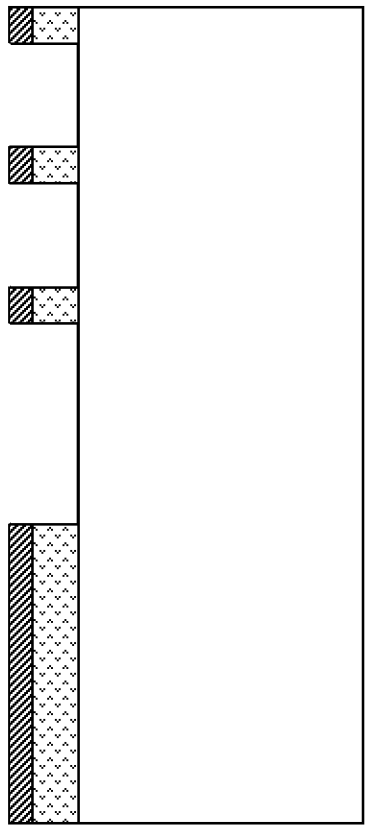
Figure 8C:
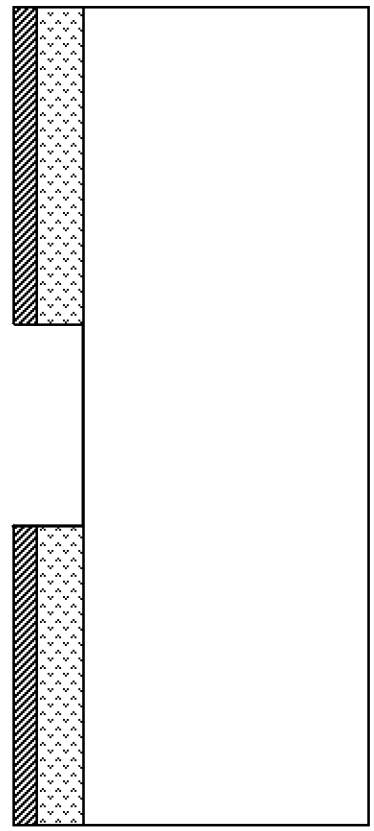

Next, a hard mask (HM) etch is performed to etch away exposed portions of the nitride layer and silicon oxide layer. The etching stops at the silicon surface. The remaining PR is then removed. In FIGS. 8AA', 8BB', and 8LL', trench openings are formed in exposed areas. In FIG. 8CC', all the nitride layer and silicon oxide layer are removed along the CC' cross section.

Figure 9A:
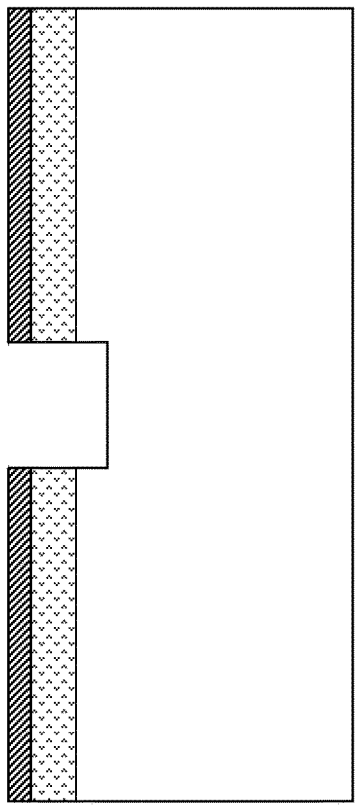
Figure 9B:
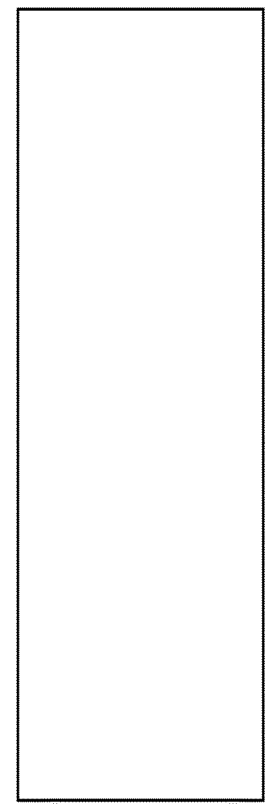
Figure 9L:
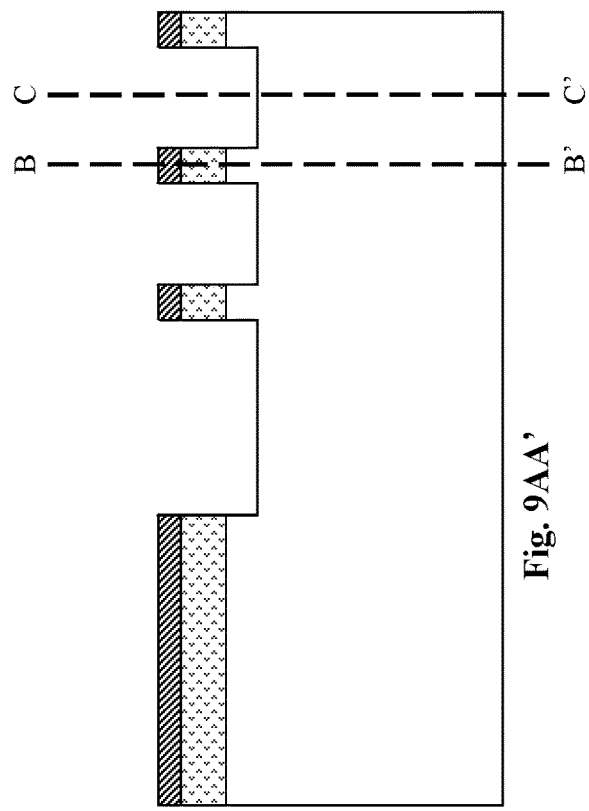
Figure 9C:
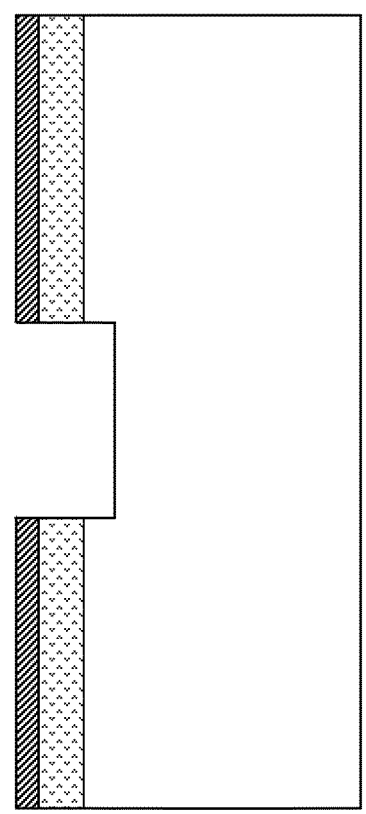

A trench etch follows. In FIGS. 9AA', 9BB', and 9LL', the trench openings are etched deeper. In some embodiments, the target depth of the trenches is approximately 0.3 um~0.5 um. In FIG. 9CC', a silicon layer is removed along the CC' cross section.

Figure 10A:
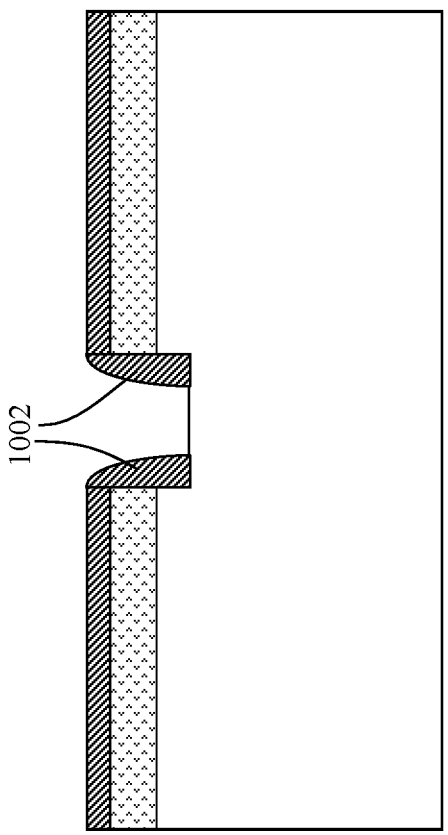
Figure 10B:
Figure 10L:
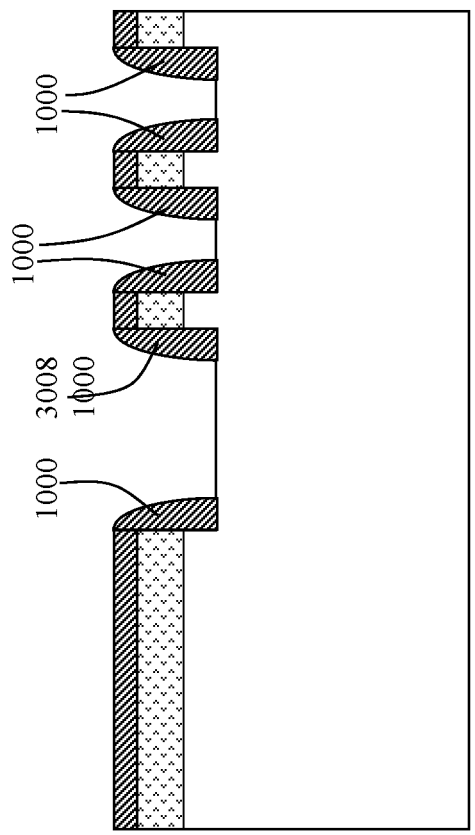
Figure 10C:
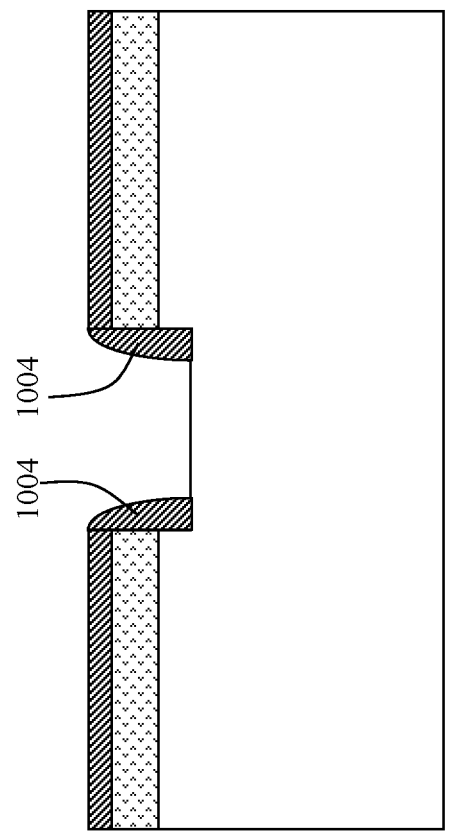

A thin layer of oxide is deposited or grown thermally in the trench openings, lining both the trench bottom and the trench walls. The oxide layer is approximately 200 Å thick in some embodiments. Once the oxide is formed, an additional layer of nitride is deposited and etched back along the horizontal surface. In some embodiments, the thickness of the nitride layer is approximately 2200 Å. Nitride spacers 1000, 1002, 1004 are formed along the trench walls after blanket etch back, as shown in FIGS. 10AA', 10BB', and 10LL'. The CC' cross section is unchanged since the liner oxide and the nitride are etched off.

Figure 11A:
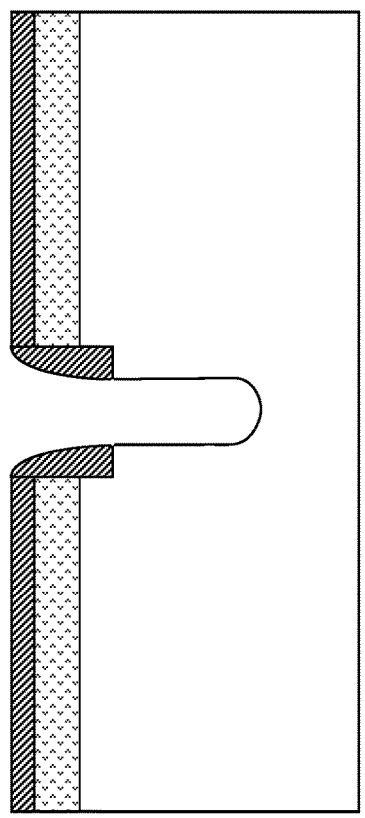
Figure 11B:
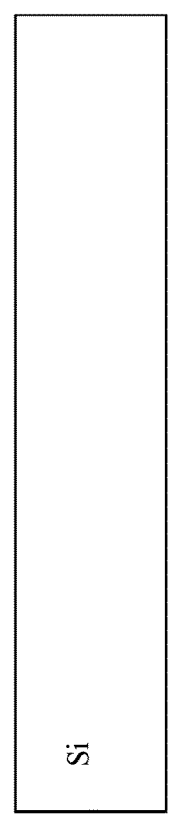
Figure 11L:
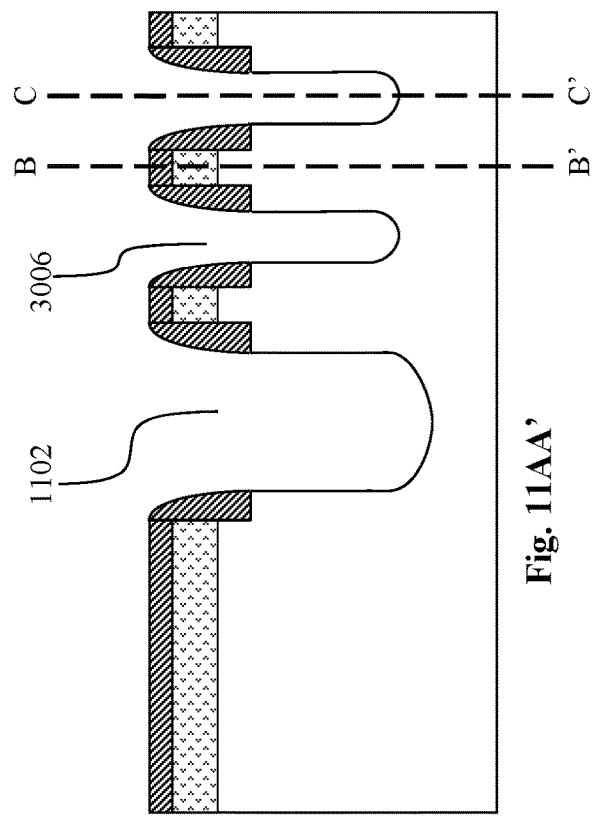
Figure 11C:
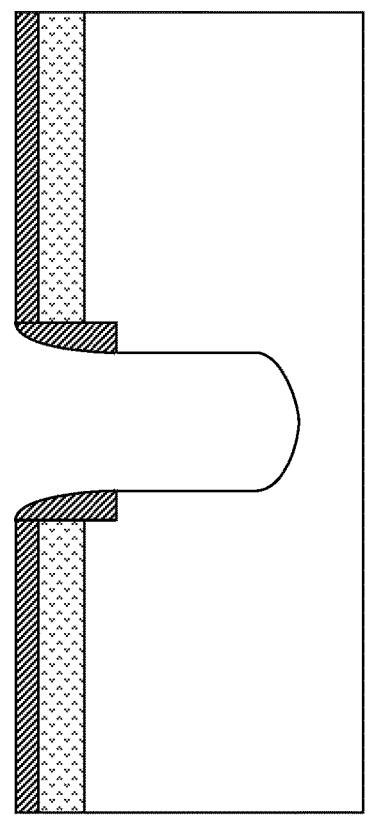

Next, any exposed liner oxide layer in the bottom of the trench opening is removed and a blanket silicon etch step is performed to further deepen the trenches in FIGS. 11AA', 11BB', 11CC', and 11LL'. The resulting trench depth is on the order of approximately 1.5 um~2.5 um depending on device application, and the trench walls are sloped at an angle of approximately 87°~88°. The nitride spacers allow for a self-aligned etching step that does not require additional alignment steps such as an additional alignment mask, thus achieving trench slope etch. A wider trench opening results in a deeper trench than a narrower trench opening due to the nature of Si etch loading factor. For example, since gate runner contact opening 702 is wider than active gate contact opening 704, the resulting gate runner trench 1102 is deeper than active gate trench 1104, as shown in FIG. 11AA'. The depth of the trenches may range from a few hundred angstroms to a few microns. Round hole (R/H) etch ranging from 250 Å~500 Å is performed to make the corners of the trenches smoother to prevent high electric fields due to sharp corner.

Figure 12A:
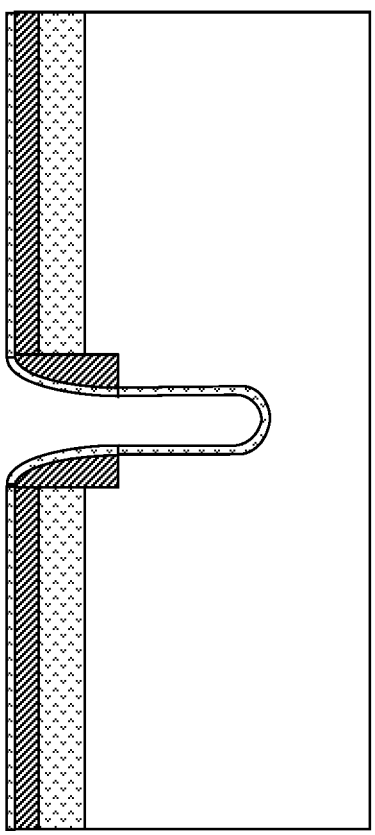
Figure 12B:
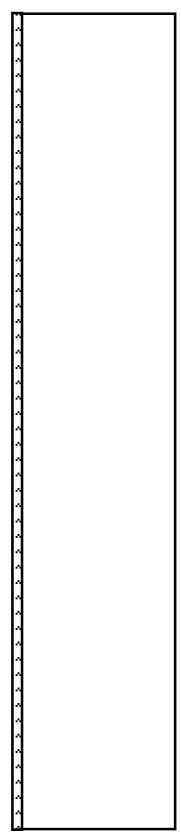
Figure 12L:
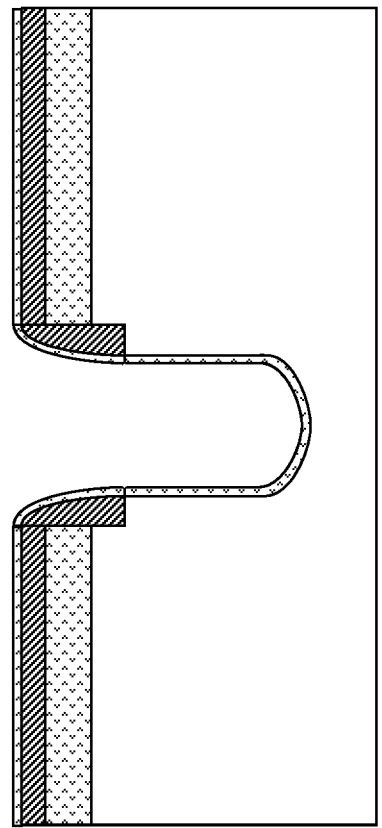
Figure 12C:
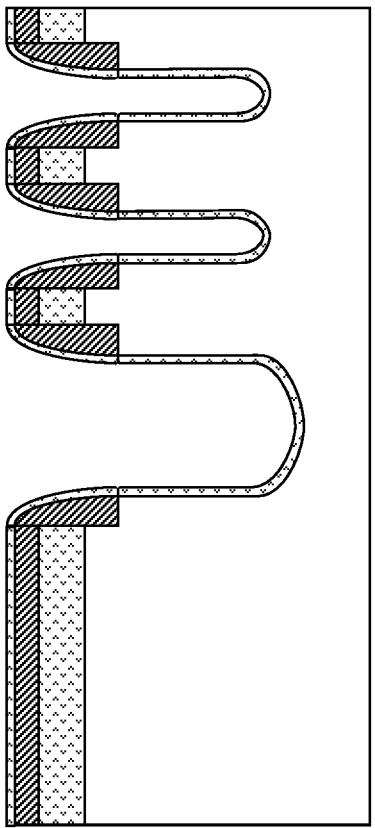

In FIGS. 12AA-12LL', one or more oxide layers are deposited or thermally grown. In some embodiments, a sacrificial oxide layer of approximately 500 Å is optionally grown and removed to improve the silicon surface. A layer of gate oxide of approximately 250 Å is grown, followed by a layer of high temperature thermal oxide (HTO) of approximately 900 Å.

Figure 13A:
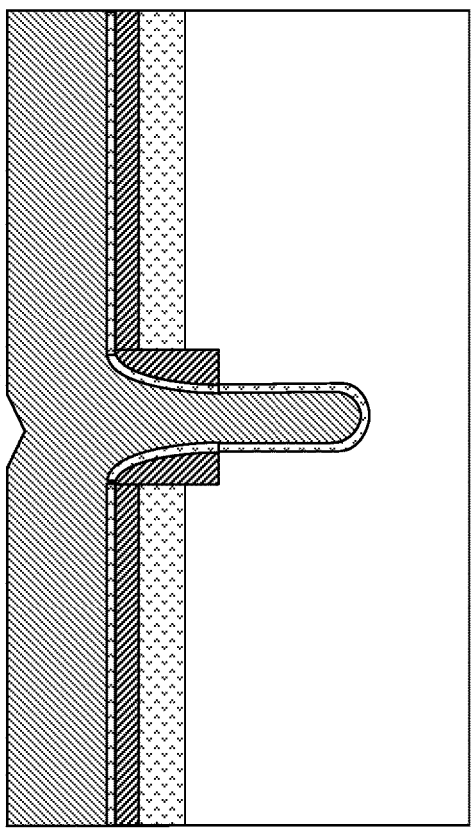
Figure 13C:
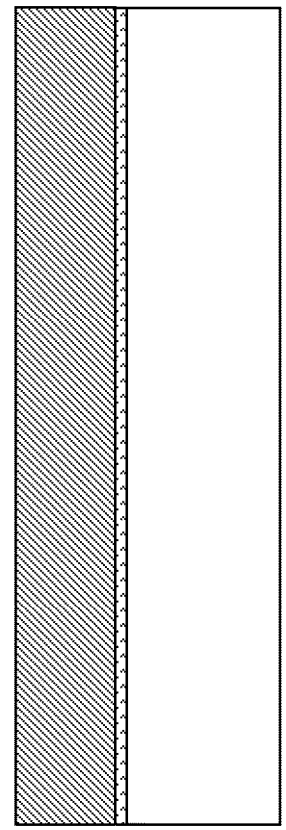
Figure 13L:
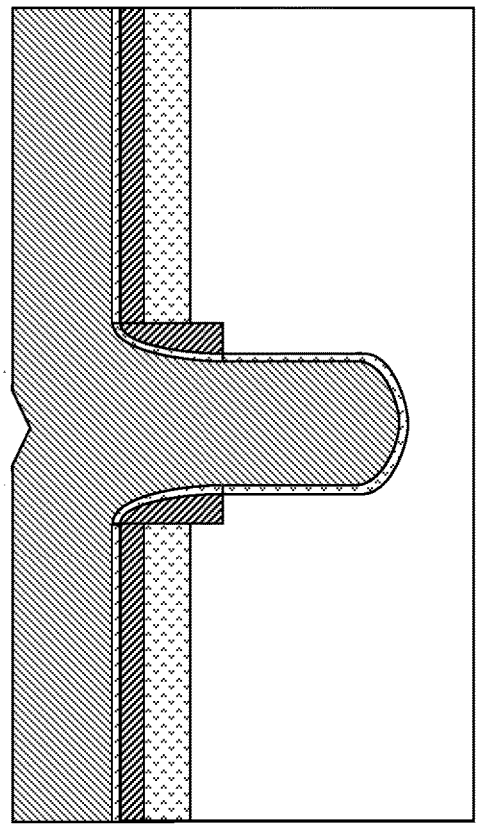
Figure 13B:
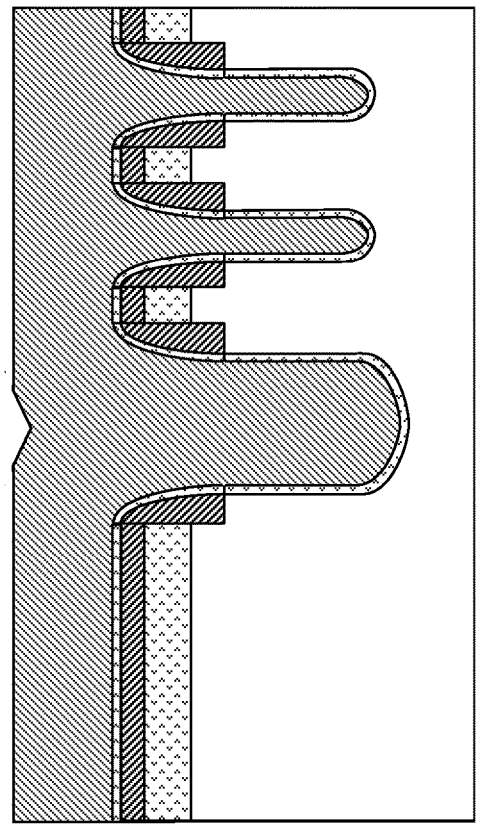

Polysilicon (poly) is disposed, as shown in FIGS. 13AA-13LL'. In some embodiments, the thickness of the poly is approximately 12000 Å, which is greater than half the width of the widest trench. Thus, poly layers on the sidewalls merge and completely fill all the trenches. This layer of poly is sometimes referred to as source poly, shield poly, or poly 1.

Figure 14A:
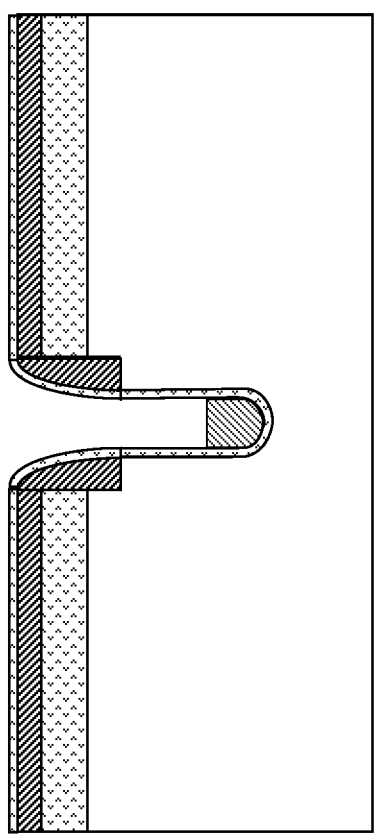
Figure 14B:
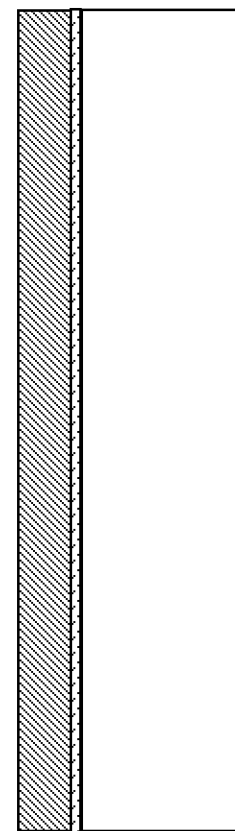
Figure 14L:
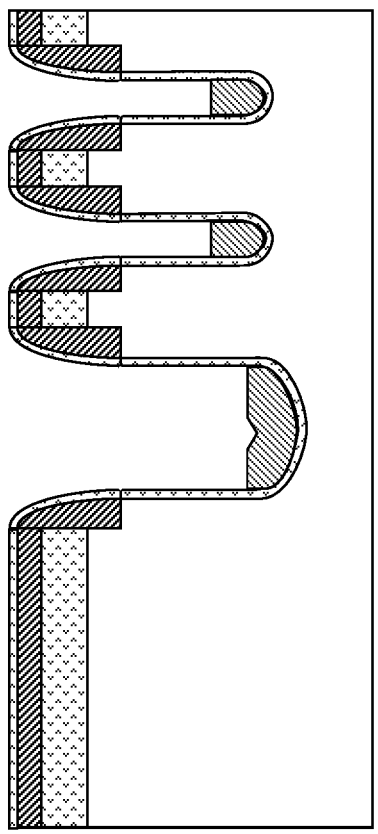
Figure 14C:
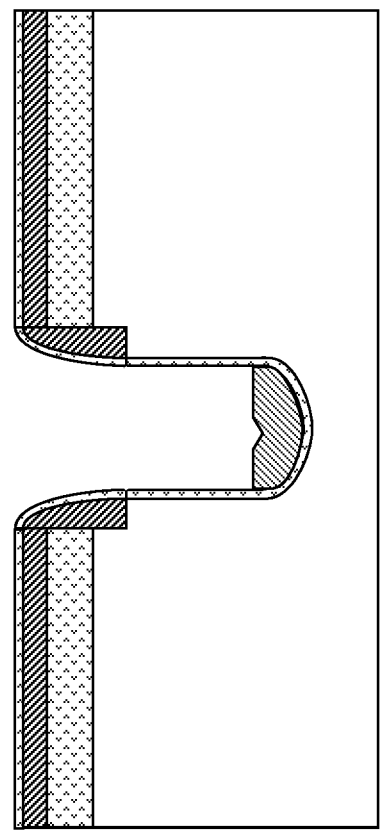

The source poly is then etched back using dry etch, as shown in FIGS. 14AA'-14LL'. In this example, in the active gate trenches, the remaining poly has a thickness of approximately 6000 Å.

Figure 15B:
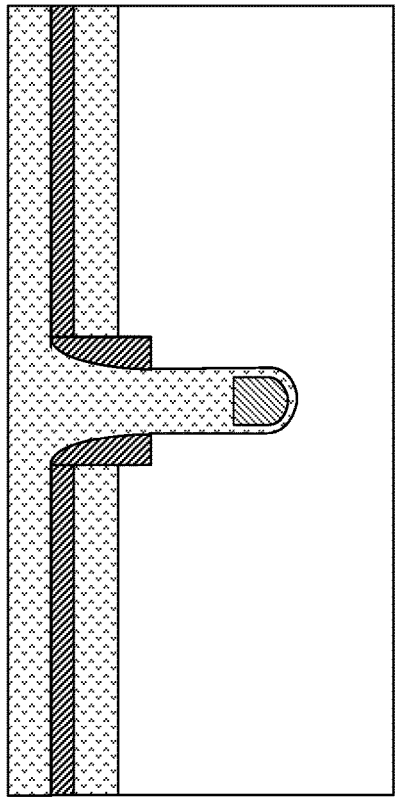
Figure 15C:
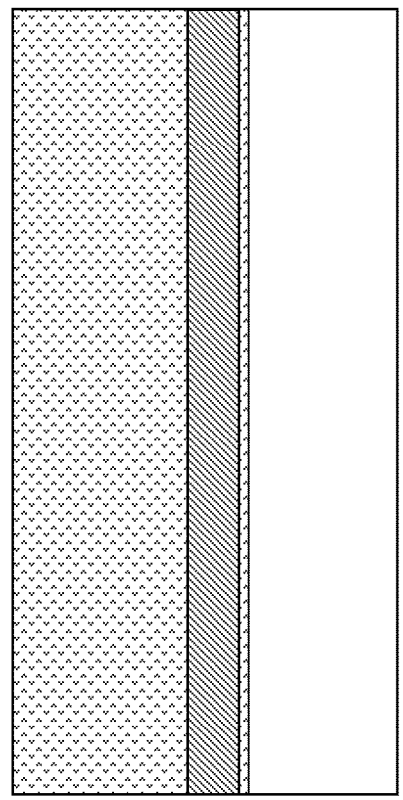
Figure 15A:
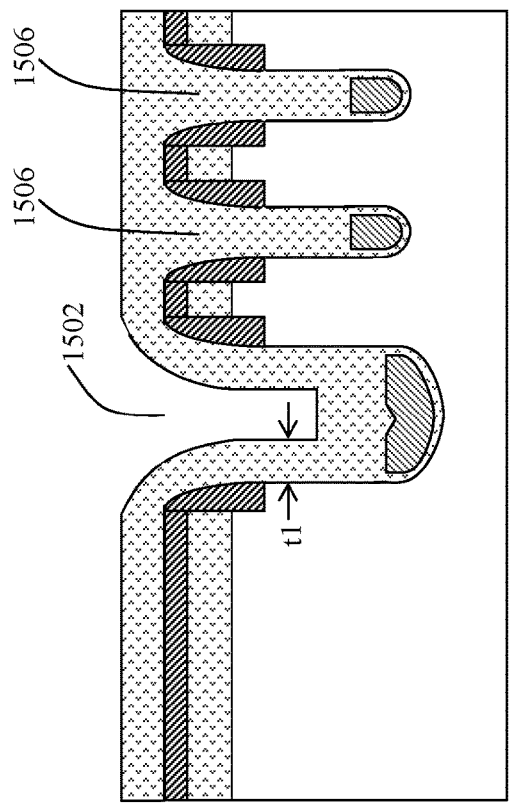
Figure 15L:
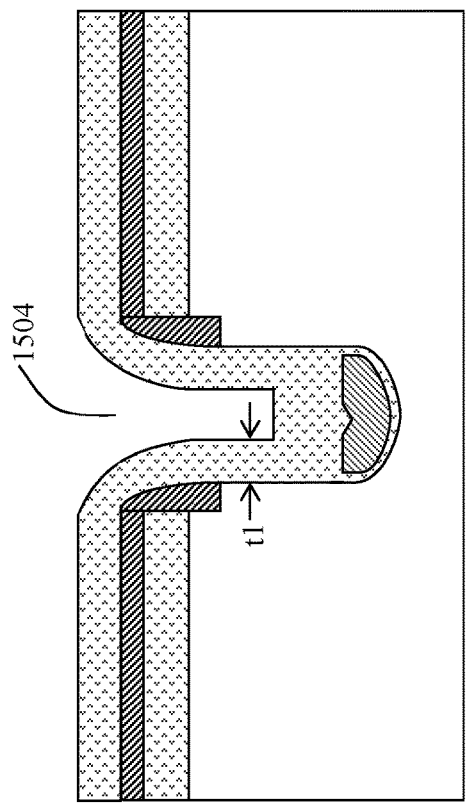

High density plasma (HDP) oxide is then deposited and densified. In some embodiments, the densification takes place at a temperature of approximately 1150° C. and lasts for approximately 30 seconds. The oxide on the trench sidewalls has a substantially uniform thickness (labeled as t1 in FIGS. 15AA'-15LL') throughout the device. In some embodiments, t1 is approximately ranging from 2000 Å4000 Å to completely fill only the narrow trenches (such as active gate trencher and source contact trenches), but partially fill the wider trenches such as gate runner trench 1502 and gate pickup trench 1504. Thus, the wider trenches are not completely filled, allowing a gate electrode to be disposed in the space not completely filled by the HDP oxide in such wider trenches in a later step. In narrower trenches such as active trenches 1506, the thickness of the oxide layer t1 is greater than half the width of the trench, and thus the oxide linings merge and completely fill the trench.

Figure 16A:
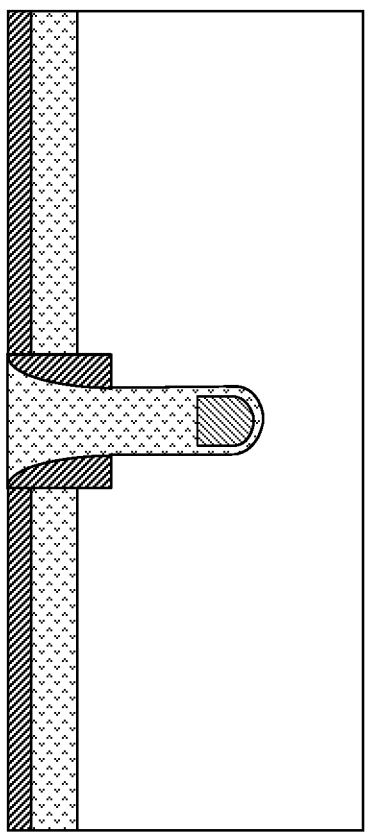
Figure 16B:
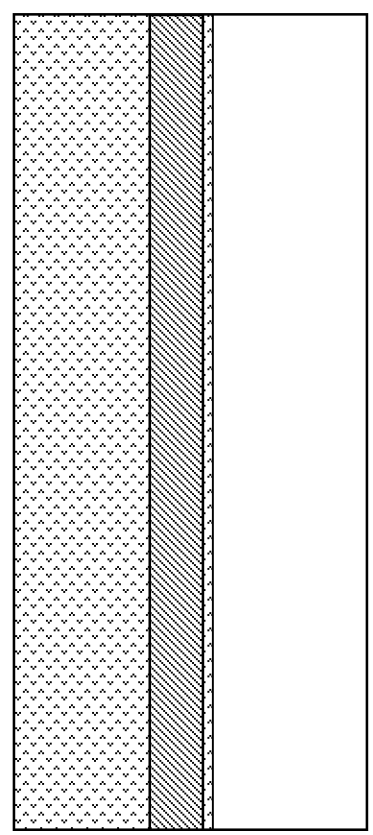
Figure 16L:
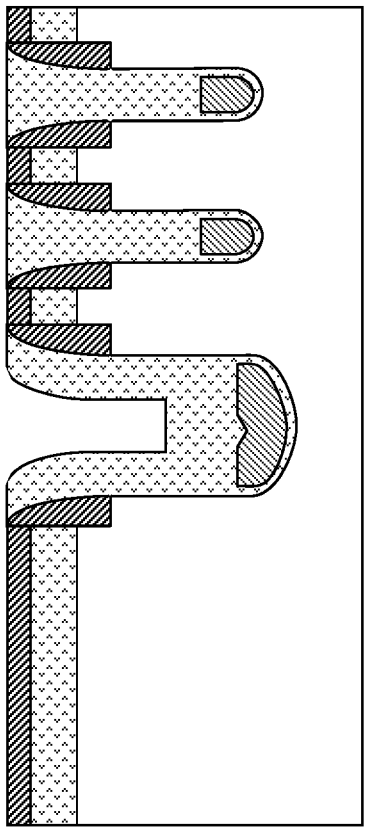
Figure 16C:
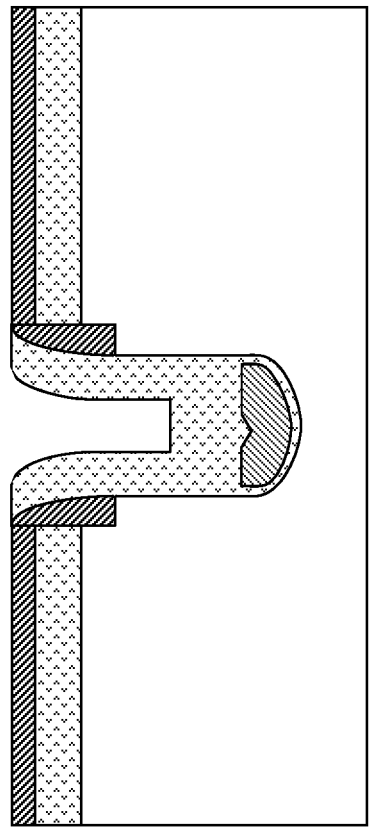

Oxide chemical mechanical polish (CMP) is performed. As shown in FIGS. 16AA'-16LL', the CMP process is used to polish the oxide until the top surface of the oxide is even with the nitride surface, which serves as an etch stop.

Figure 17A:
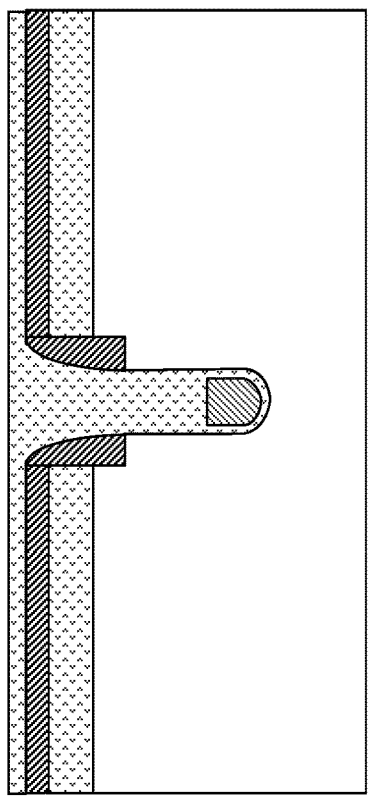
Figure 17B:
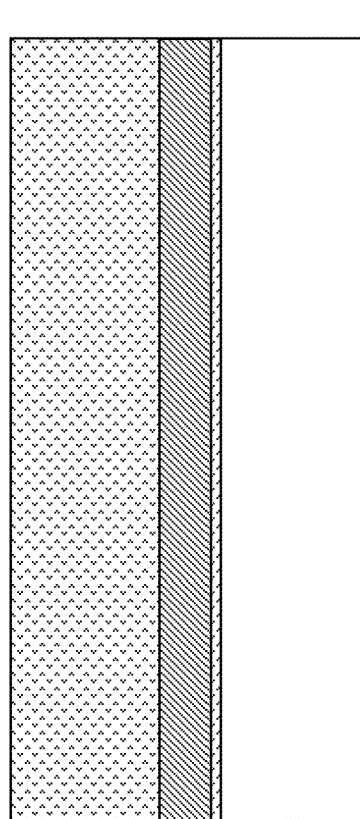
Figure 17L:
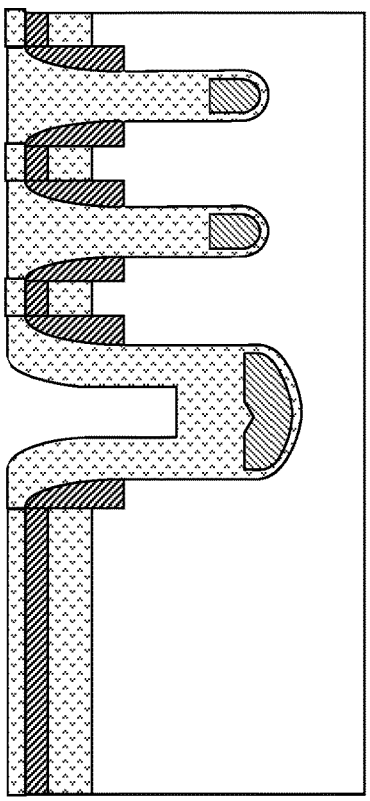
Figure 17C:
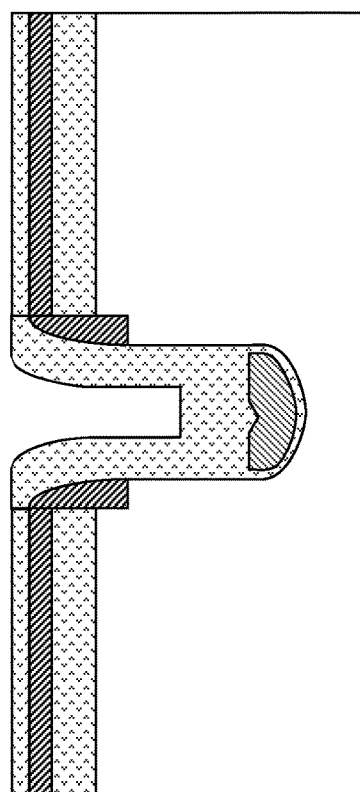

FIGS. 17AA'-17LL' show that another layer of oxide is added. The thickness of the oxide layer is approximately 1000 Å~2000 Å in some embodiments. The thickness of this oxide controls the degree of undercut of wet etching under the second mask. This oxide film also protects the nitride in all the non-active area of the device. The protected nitride allows maskless blanket etching of the Si later.

Figure 3:
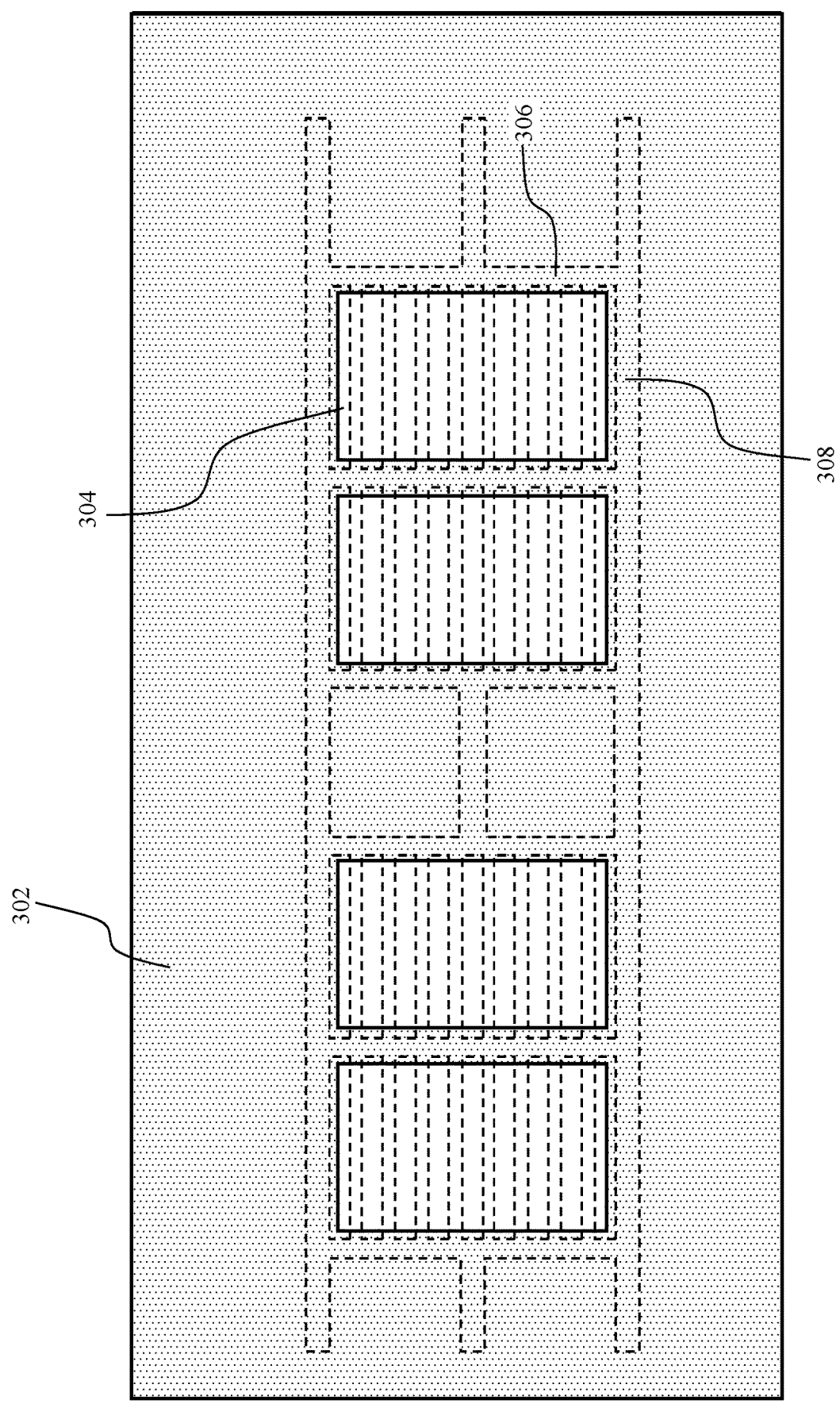
FIG. 3 is a diagram illustrating an example of a second mask used in an embodiment of a device fabrication process.

A layer of photo resist is then spun on the surface of the structure and a second mask is applied. FIG. 3 is a diagram illustrating the top view of an example of a second mask. The outline of the previous mask, the trench mask, is shown in dashed lines. The outline of the second mask, also referred to as the poly cover mask, is shown in solid lines. The poly cover mask is used to facilitate the formation of the inter-polysilicon oxide region and the termination protection region. PR in area 302 (shaded area) of the poly cover mask is not exposed and kept, thus covering the areas underneath and protecting the areas from oxide wet etching. PR in areas such 304 (un-shaded areas) of the mask is exposed and removed. Areas not covered by PR are etched. The active MOSFET cells are formed within openings such as 304. As will be described in greater detail below, the edges of the openings are placed close to termination trenches such as 306 and 308 to facilitate asymmetric etching of these trenches.

Figure 18A:
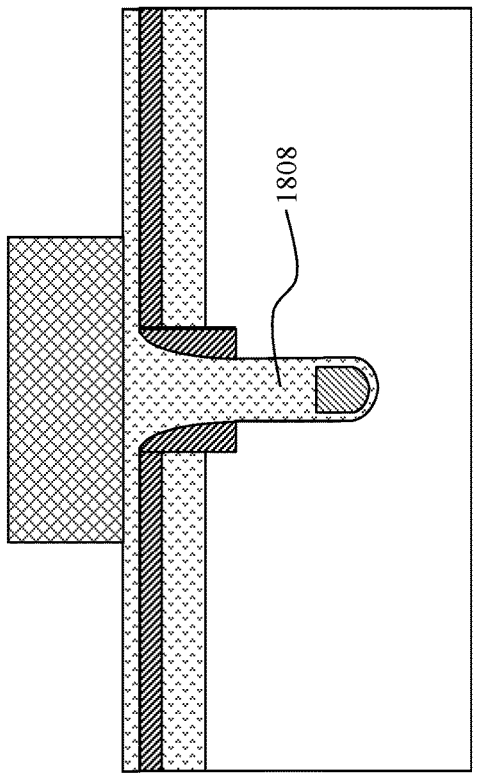
Figure 18B:
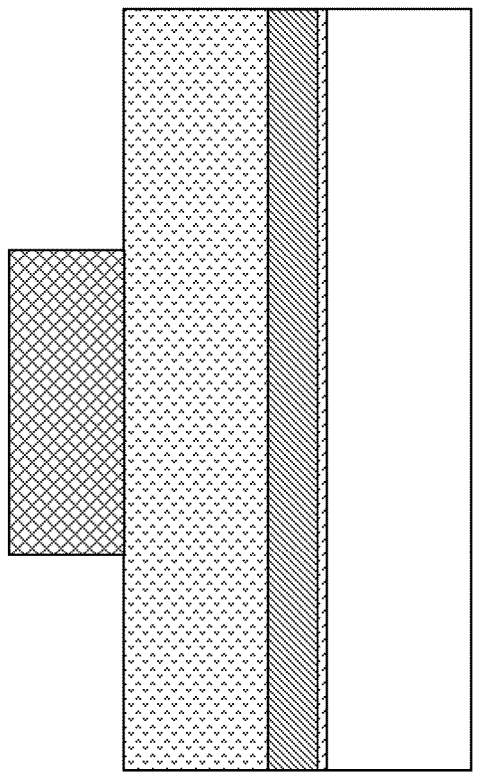
Figure 18L:
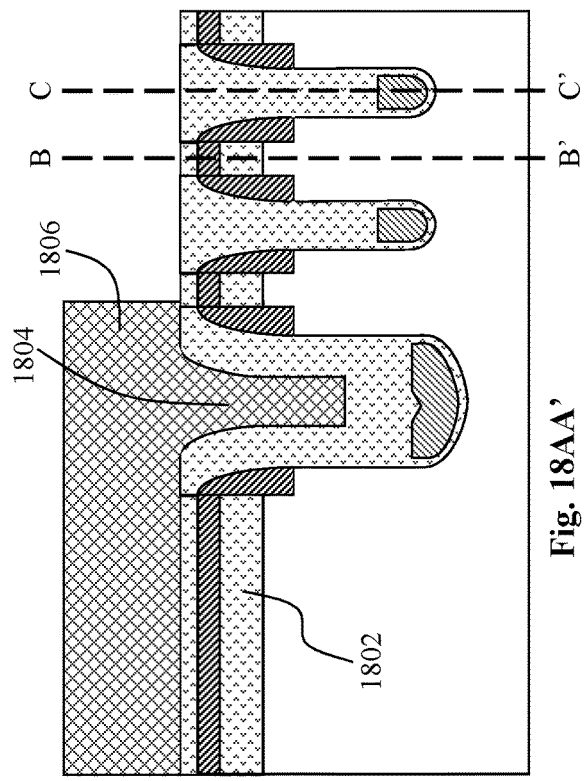
Figure 18C:
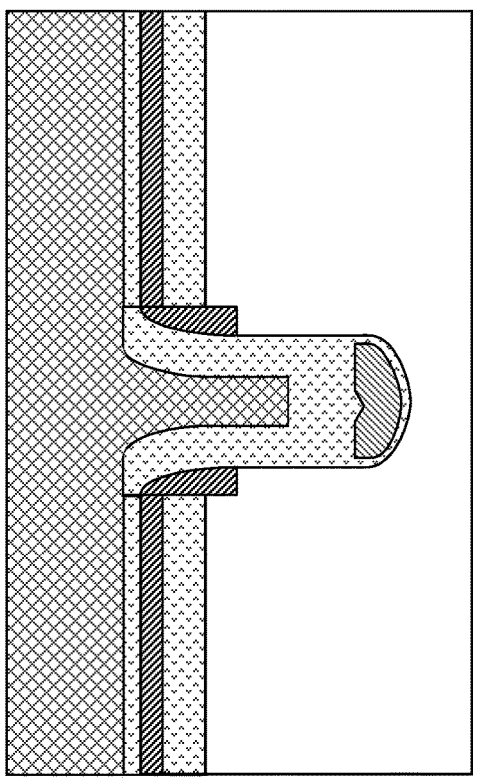

FIGS. 18AA', 18BB', 18CC', and 18LL' show the pattern of the PR cover after the exposed portions have been removed. In FIG. 18AA', the PR cover in the AA' cross sectional area extends into termination region at 1802, fills termination trench at 1804, and extends over into the active area at 1806. As will be shown in connection with FIG. 19AA' below, a portion of the oxide under the PR will be removed by etching. Mask overlap and wet etch undercut together determine the final profile. Thus, the distance of the PR cover extending into the active region in part determines on how much oxide will be removed by etching. The oxide undercut depth ranges from 0.6 um~1.5 um. In FIG. 18BB', the PR cover shields source poly pickup trench 1806 from being etched. In FIG. 18CC', the PR cover shields a portion of the nitride in the desired contact location. In FIG. 18LL', the gate pick up contact trench and its adjacent areas are covered by PR.

Figure 19A:
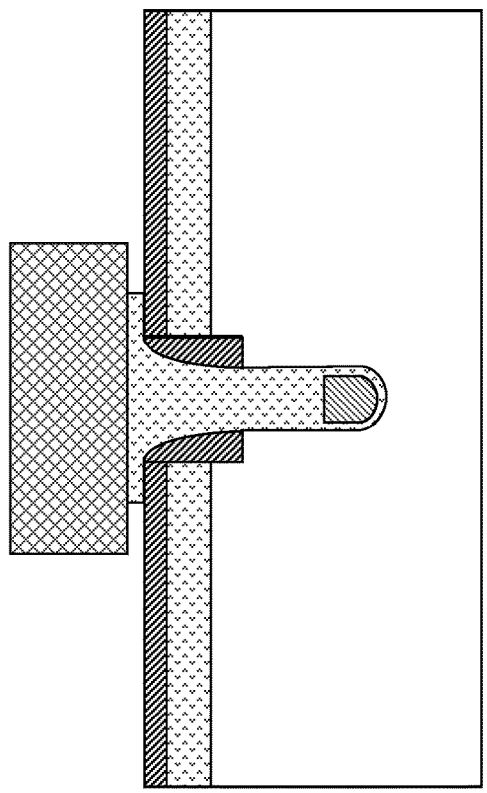
Figure 19B:
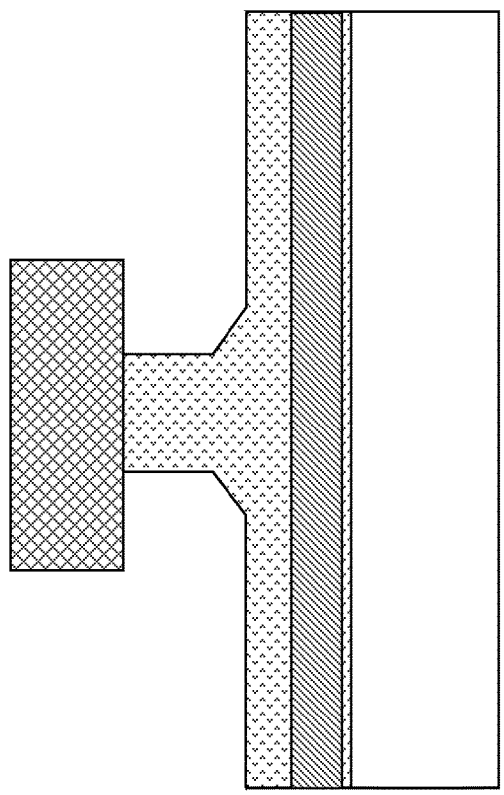
Figure 19L:
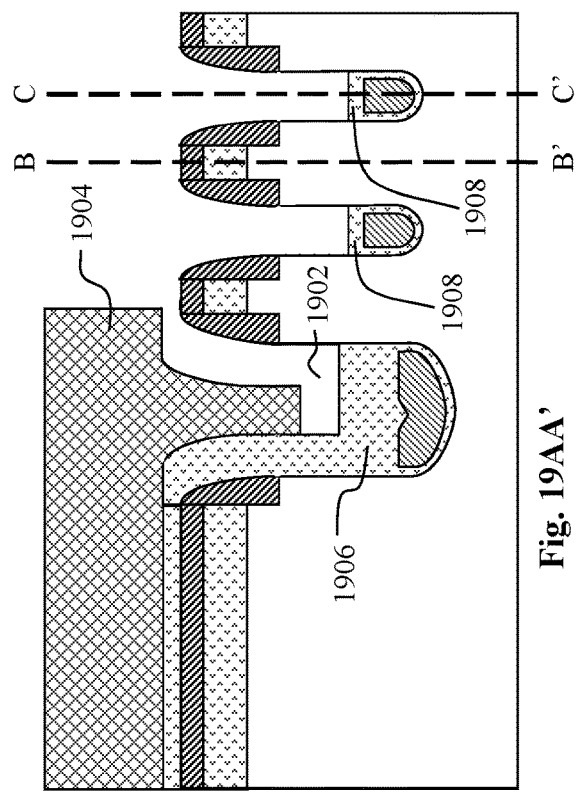
Figure 19C:
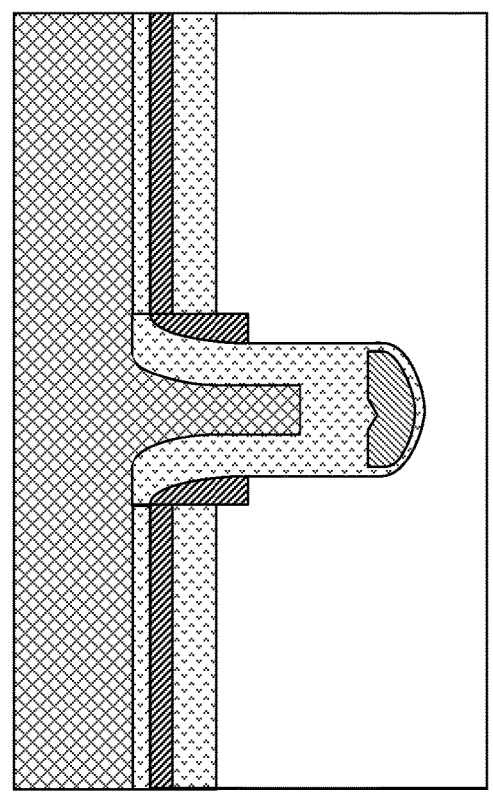

Wet etch is then performed. The results are shown in FIGS. 19AA'-19LL'. Some oxide in areas unmasked by PR is removed, such that the remaining oxide is held at desired height. Some oxide near the edges of the PR is also removed. In FIG. 19AA', a portion of oxide in gate runner trench 1902, located underneath the PR and close to the PR edge is removed. The amount of oxide that is etched can be controlled by adjusting the position of edge 1904 of PR layer. Extending edge 1904 closer to the active region would result in less oxide being etched, and extending the edge further away from the active region would have the opposite effect. The amount of oxide etched away can vary in different embodiments. In the example shown, enough oxide is etched away such that the remaining oxide lining the trench wall in the vertical direction is approximately uniform in thickness. The oxide layer above the poly, such as oxide layers 1906 and 1908, is referred to as inter-poly dielectric (IPD), which can range between a few hundred to a few thousand angstroms. In FIGS. 19BB' and 19CC', portions of oxide close to the edges of the PR covers are removed.

Figure 20B:
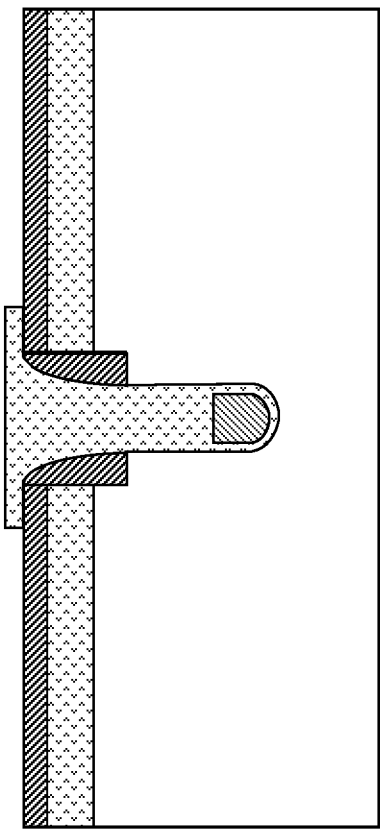
Figure 20C:
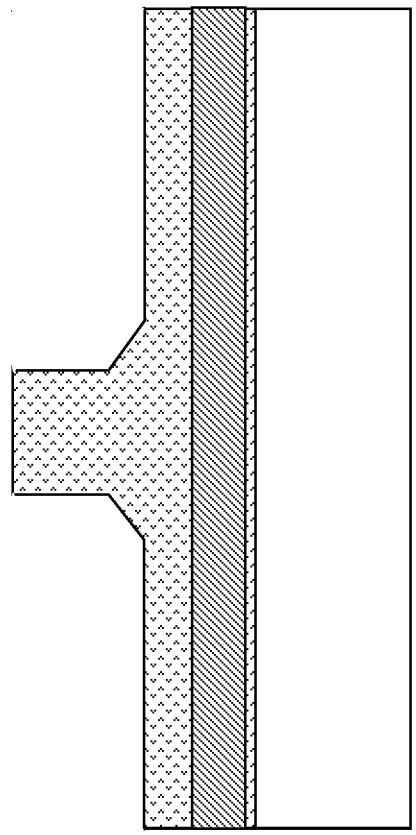
Figure 20A:
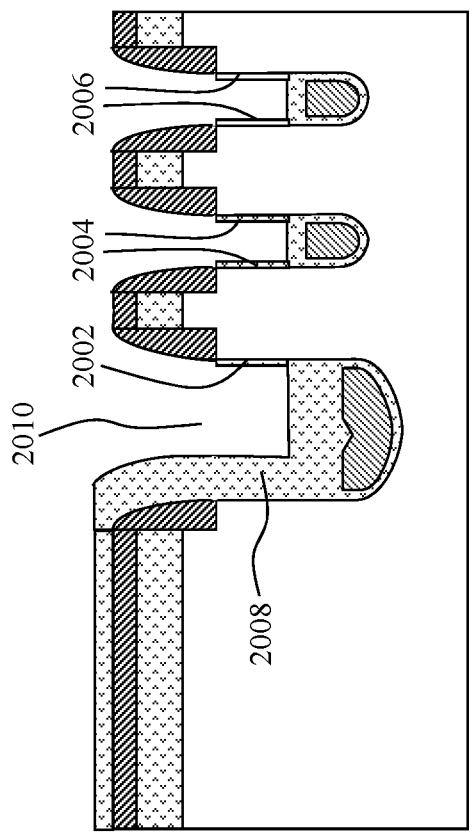
Figure 20L:
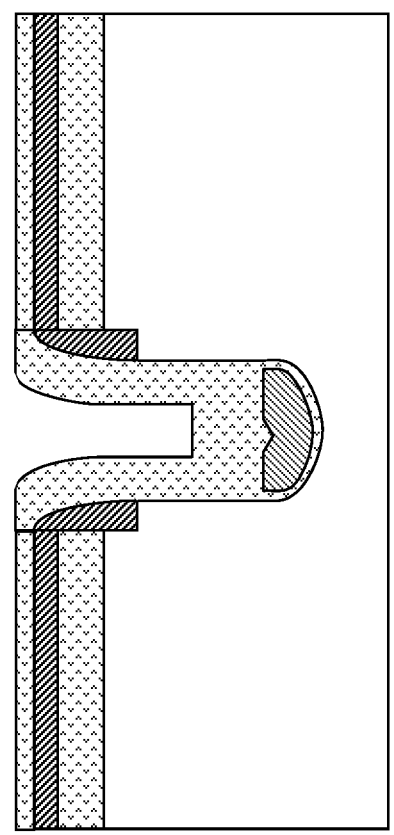

The PR is then removed, and a layer of gate oxide is disposed or thermally grown. In some embodiments, the added oxide layer is approximately 450 Å thick in some embodiments. Thus, in FIG. 20AA', trench walls such as 2002, 2004, 2006, and 2008 are lined with oxide. Termination trench 2010 has asymmetric sidewalls, where sidewall 2008 has a thicker oxide layer than sidewall 2002.

Figure 21B:
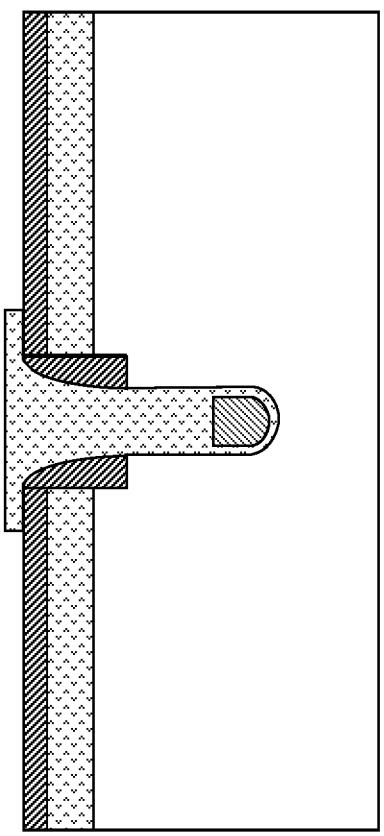
Figure 21C:
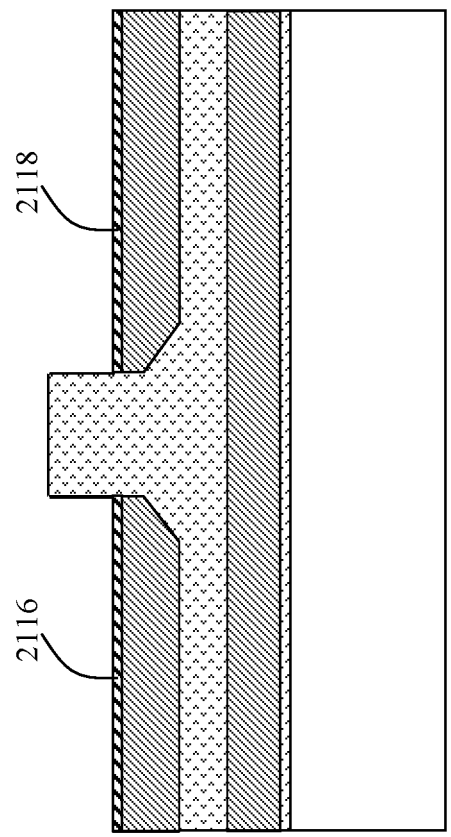
Figure 21A:
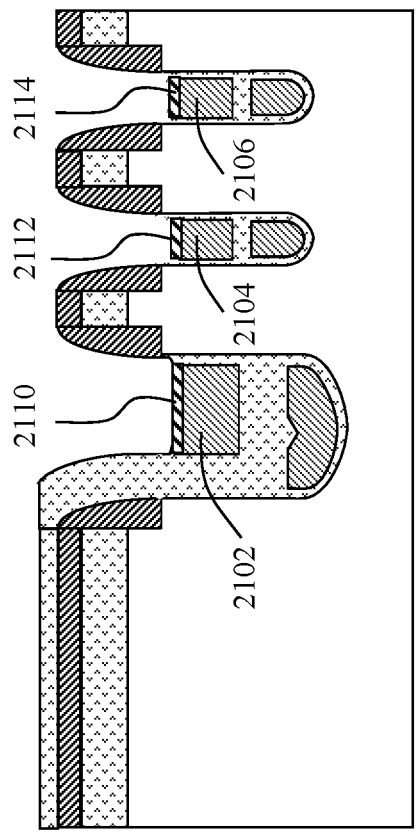
Figure 21L:
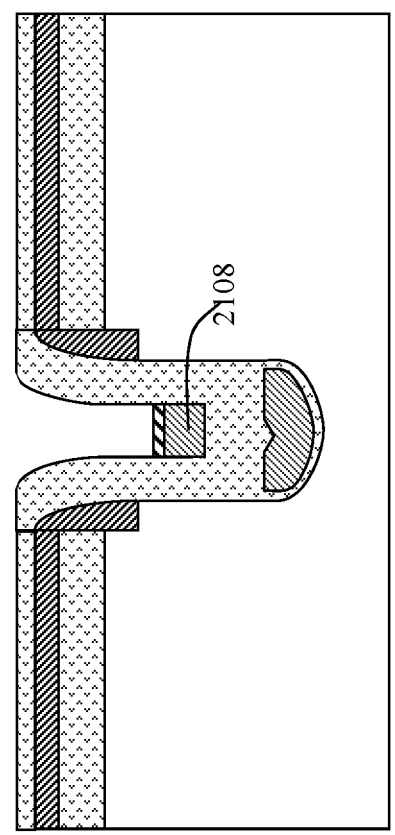

Another poly deposition and etch back is performed. In FIGS. 21AA'-21LL', approximately 8000 Å~12000 Å of poly is disposed in various trenches. The disposed poly is etched back, forming gate poly such as 2102, 2104, 2106, and 2108. In the example shown, the poly surface is approximately 500-1000 Å below nitride spacer bottom reference level. A layer of metal such as titanium or cobalt is deposited and annealed. Where the metal is in contact with the poly, a polycide layer is formed. The titanium or cobalt metal over the oxide or nitride does not form silicide and is removed. As shown, polycide is formed at 2110, 2112, 2114, 2116, and 2118 on top of gate poly electrodes.

Figure 22B:
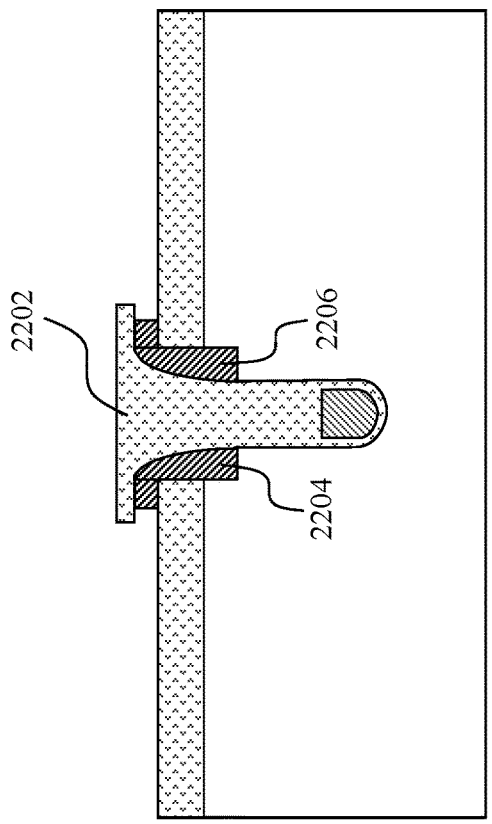
Figure 22C:
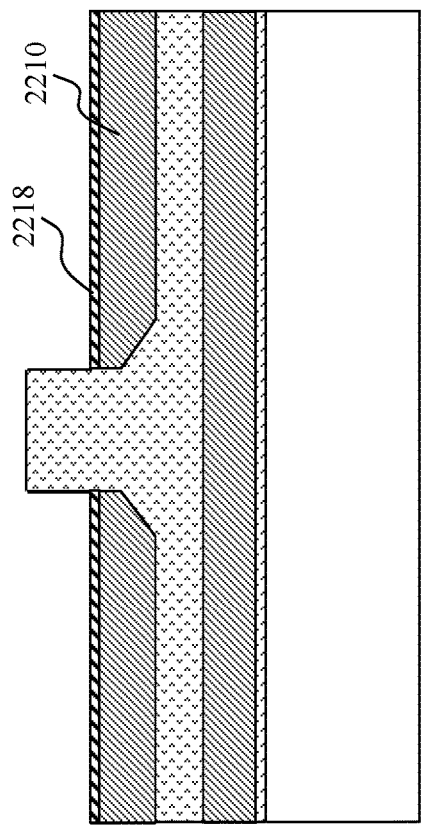
Figure 22A:
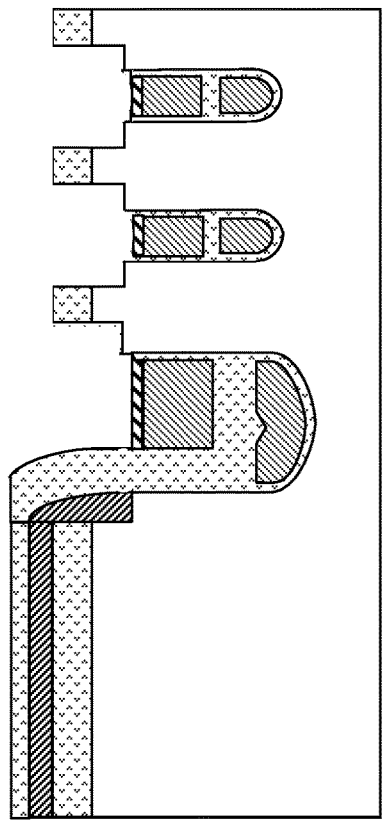
Figure 22L:
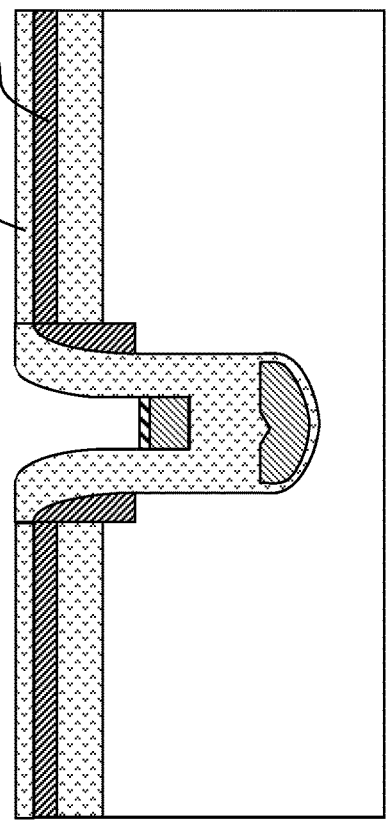

In FIG. 22AA', exposed nitride spacers in the runner gate trench and the active gate trenches are removed through a wet etch process. In FIG. 22BB', the exposed nitride layer is removed, as well as a portion of the nitride layer underneath oxide 2202. Nitride spacers 2204 and 2206 are protected from the etching process by the oxide layer. In FIG. 22LL', nitride layer 2208 are protected by oxide layer 2212.

Figure 23A:
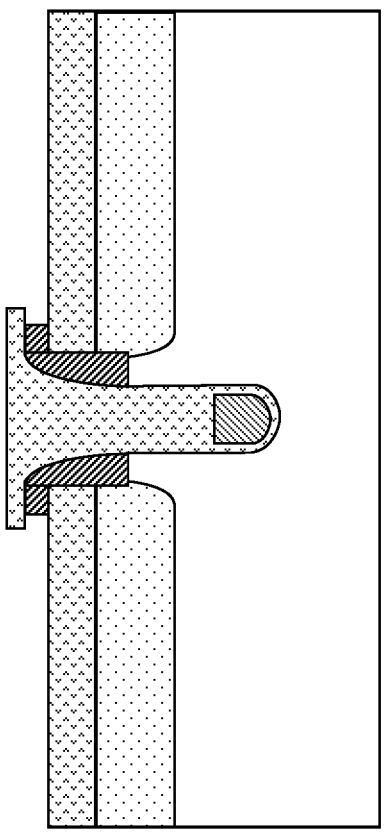
Figure 23B:
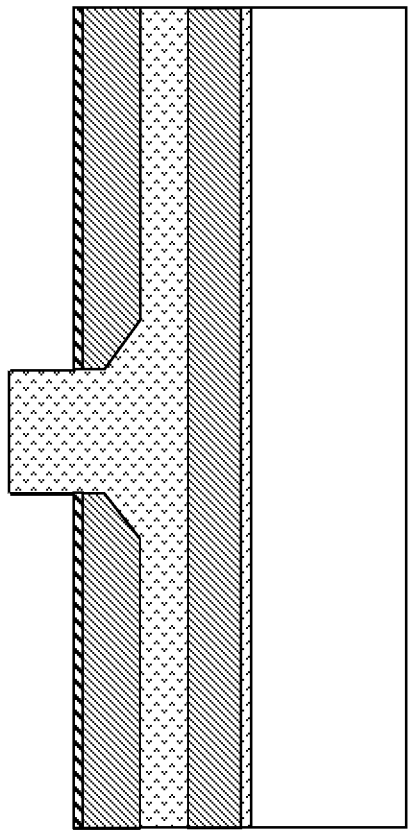
Figure 23L:
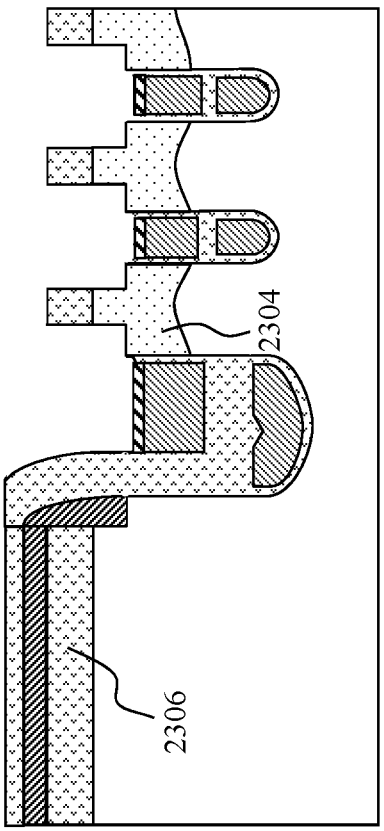
Figure 23C:
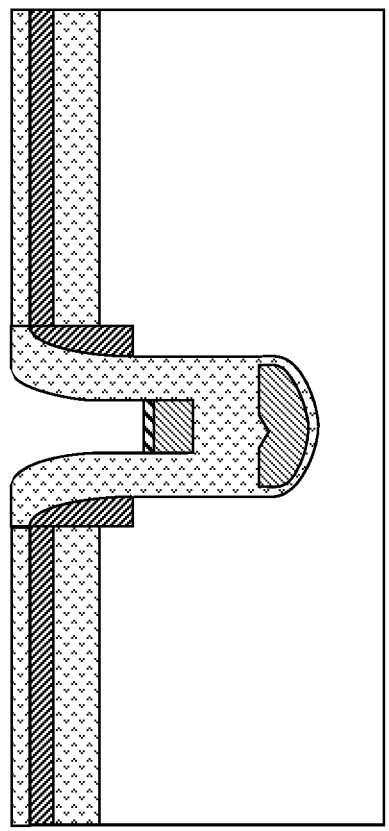

In FIGS. 23AA'-23LL', body implant takes place. The device is bombarded with dopant ions with an angle. In active areas unprotected by nitride, the implant forms body regions such as 2304. In some embodiments, Boron ions with a dosage level of approximately 1.8e13 at 60 KEV~180 KeV are used to form an N-channel device. Other types of ions can be used. For example, Phosphorous ions can be used for P-channel devices.

Figure 24A:
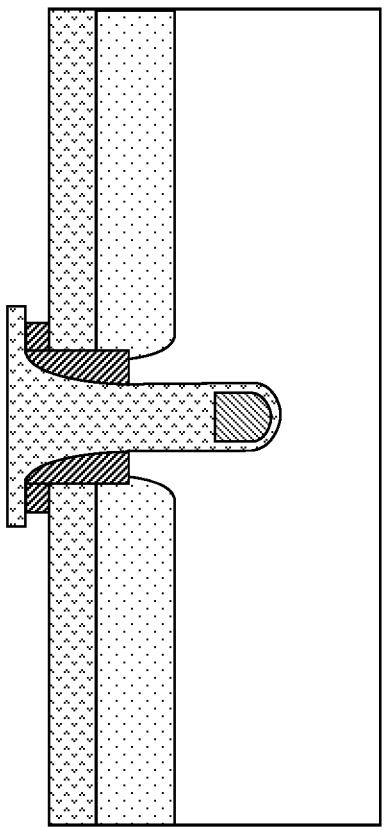
Figure 24B:
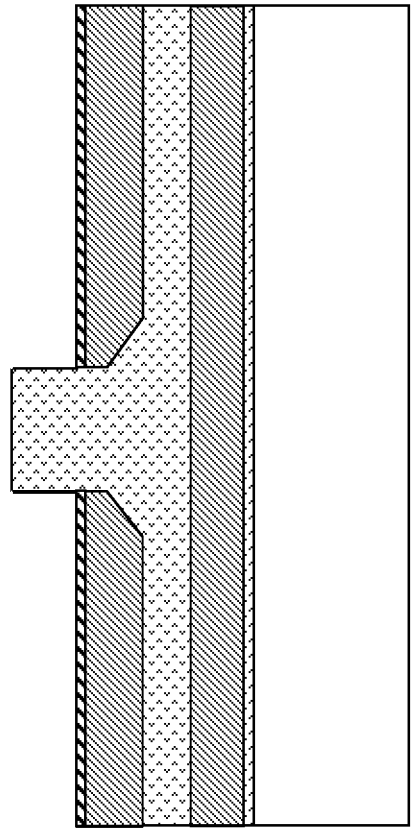
Figure 24L:
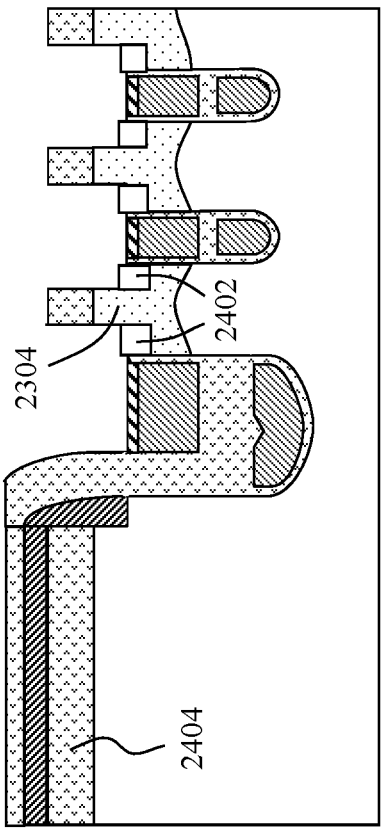
Figure 24C:
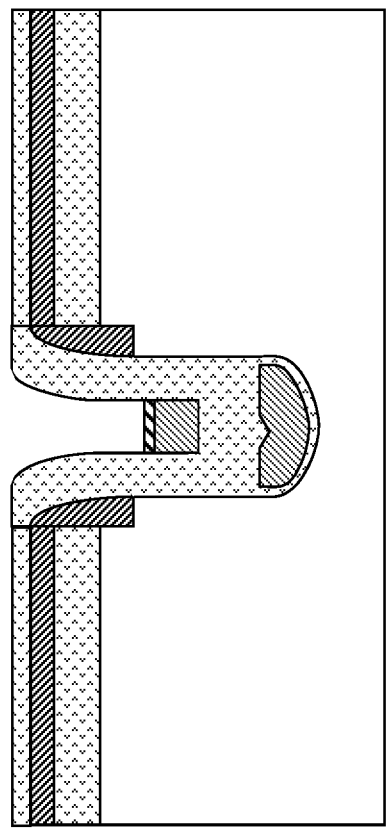

In FIGS. 24AA'-24LL', source implant takes place with a zero tilt angle. The device is again bombarded with dopant ions. In some embodiments, Arsenic ions with a dosage level of 4e15 at 40 KeV~80 KeV are used. Source regions such as 2402 are formed within body regions such as 2304.

No additional mask is required to implant the body and the source of the device. In termination areas such as 2404, the oxide-nitride-oxide barrier blocks implant ions and prevents source and body regions from being formed, thus improving device behavior in its off or blocking state.

Figure 25B:
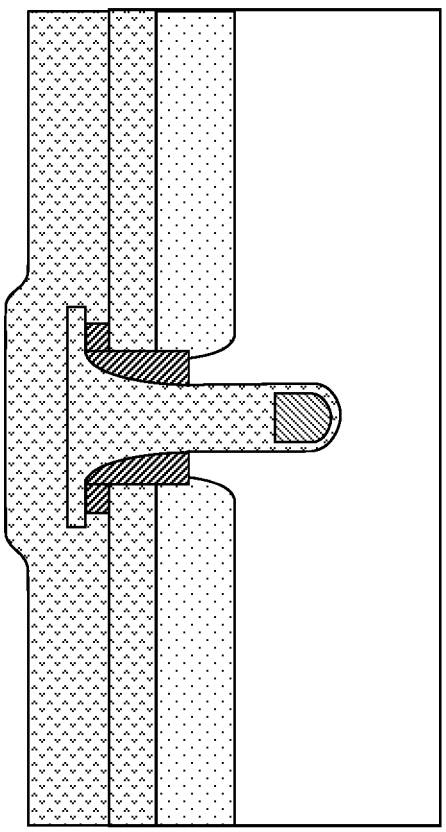
Figure 25C:
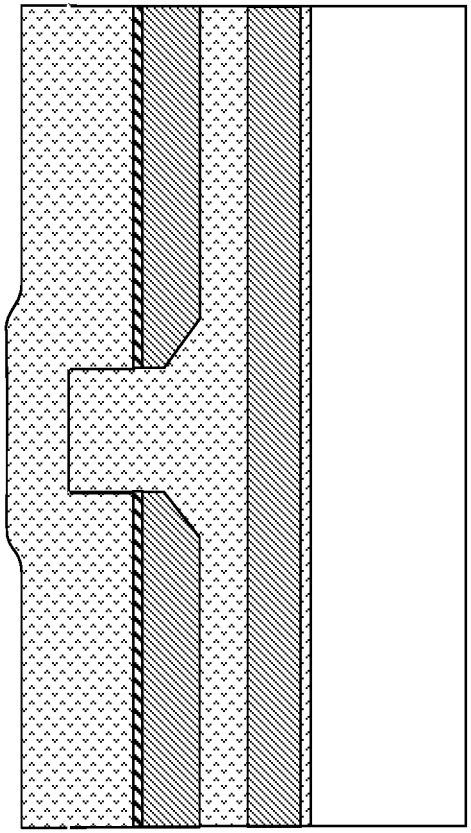
Figure 25A:
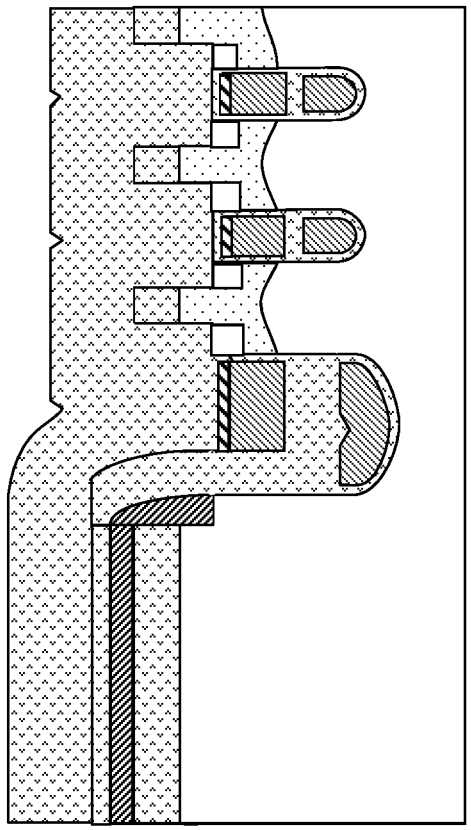
Figure 25L:
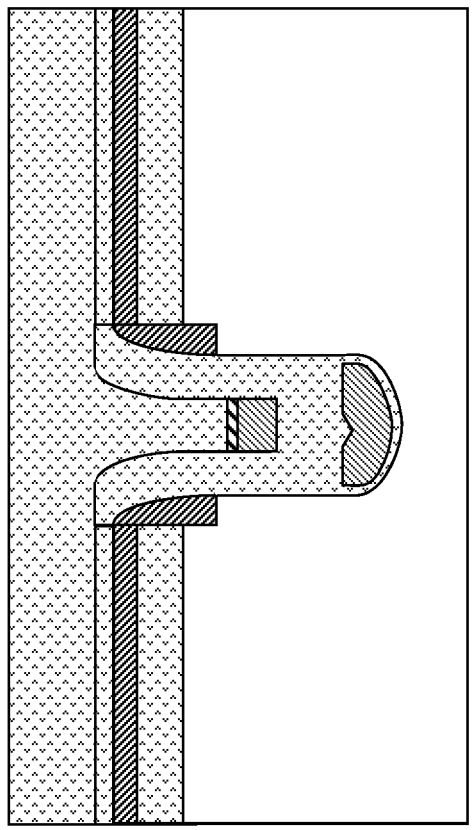

In FIGS. 25AA'-25LL', oxide ranging from 5000 Å~8000 Å is deposited through to fill trench openings and block source and gate poly regions. In some embodiments, a chemical vapor deposition (CVD) process is used to deposit Low Temperature Oxide (LTO) and Boron Phosphorus Silicate Glass (BPSG) to a thickness of approximately 5000 Å.

Figure 26A:
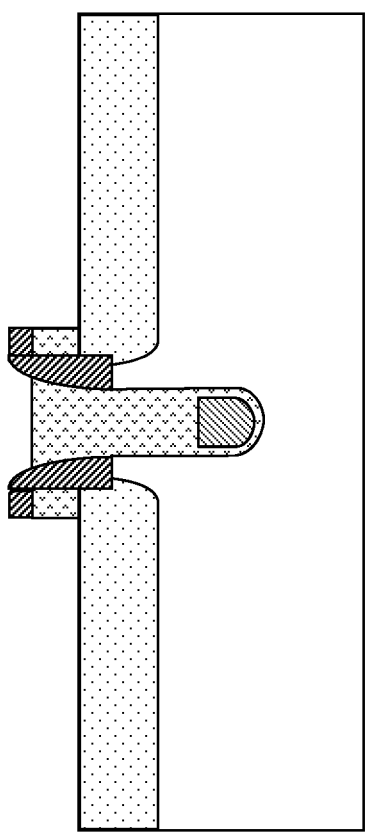
Figure 26B:
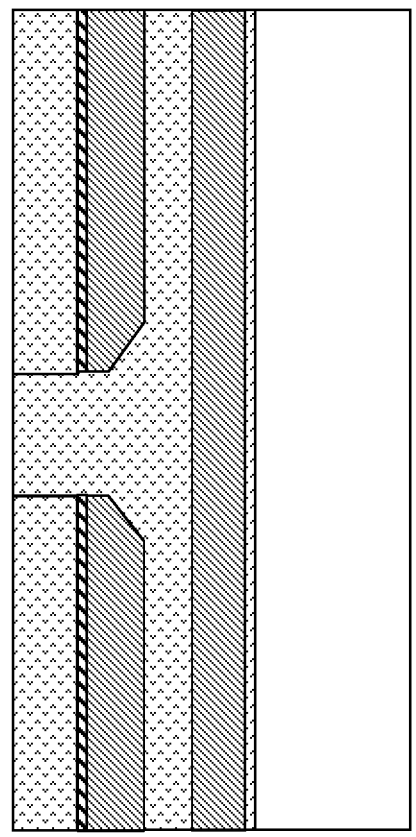
Figure 26L:
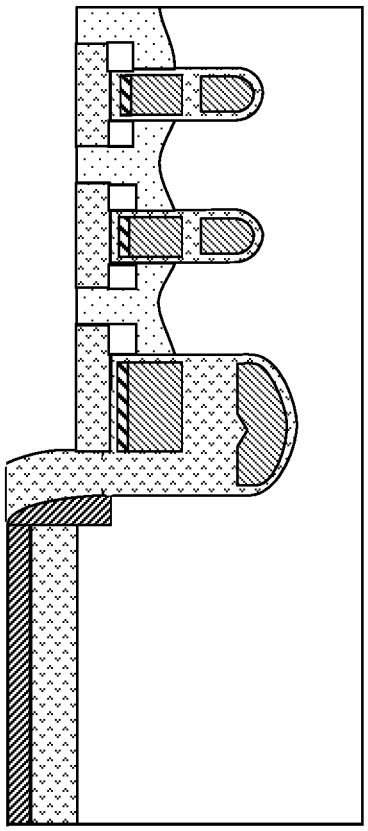
Figure 26C:
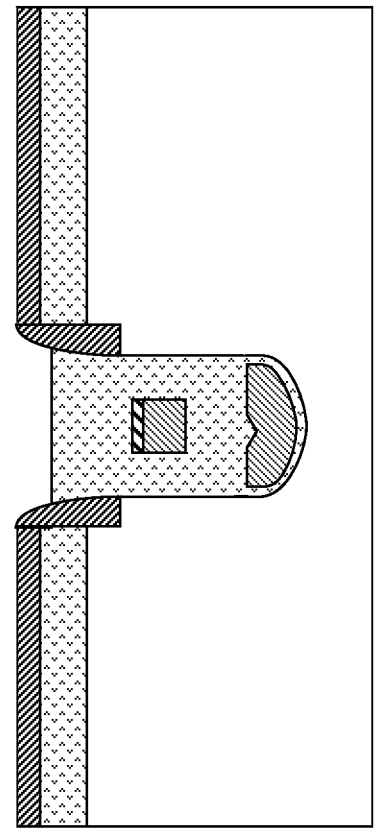

In FIGS. 26AA'-26LL', the oxide is etched back through a dry etch process where the oxide is etched down and stopped by endpoint etch on the active cell silicon surface.

Figure 27A:
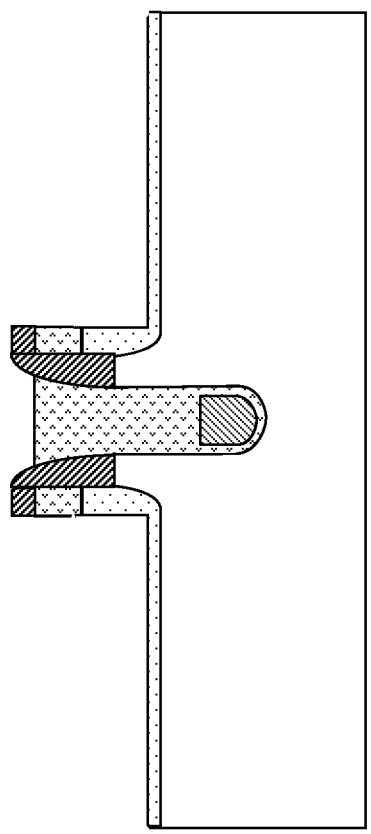
Figure 27B:
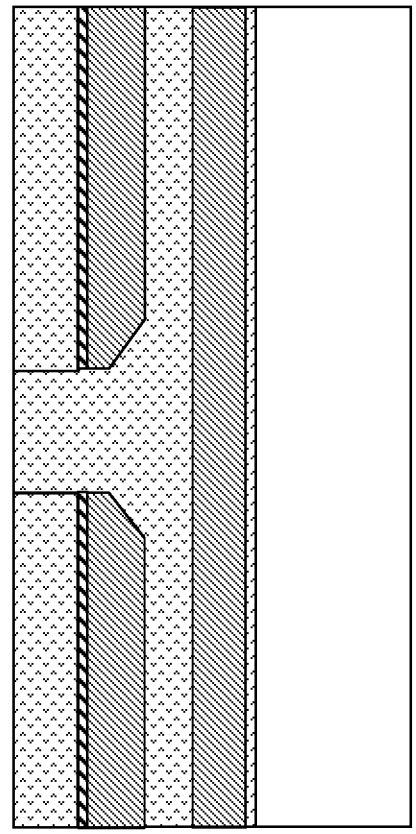
Figure 27L:
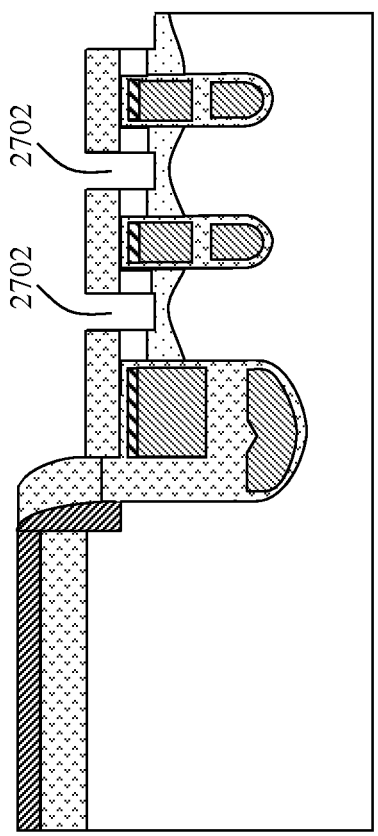
Figure 27C:
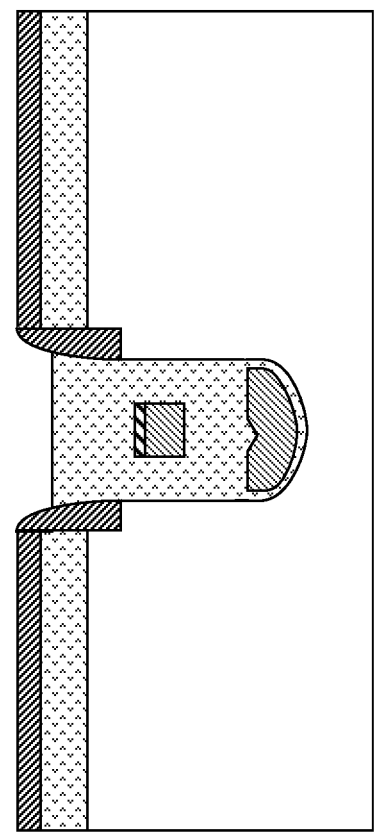

A silicon blanket etch takes place and the results are shown in FIGS. 27AA'-27LL'. The silicon etch depth is range from 0.6 um~0.9 um depending on device applications. Exposed silicon areas are etched, while areas protected by oxide and/or nitride are not etched. Since the etching process does not require an additional mask, it is referred to as a self-aligned contact process.

Another layer of PR is applied and a third mask is used. FIG. 4 is a diagram illustrating an example of a third mask. The third mask is also referred to as a poly pickup mask or contact mask. In this example, features that are masked include gate poly pickup contacts such as 402, and source poly pickup contacts such as 404.

Figure 28B:
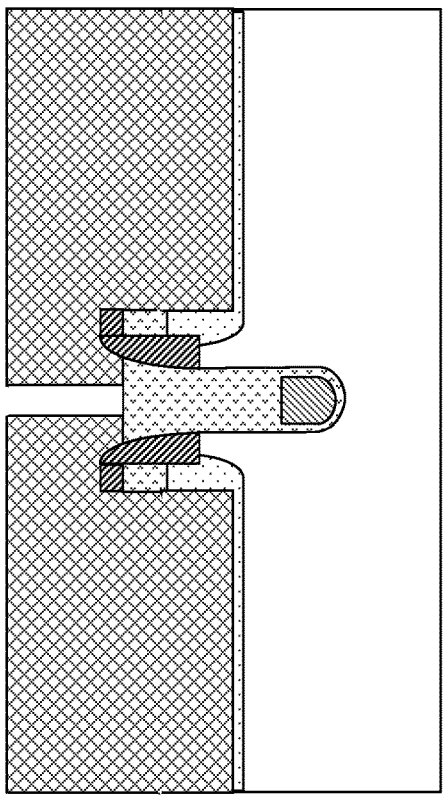
Figure 28C:
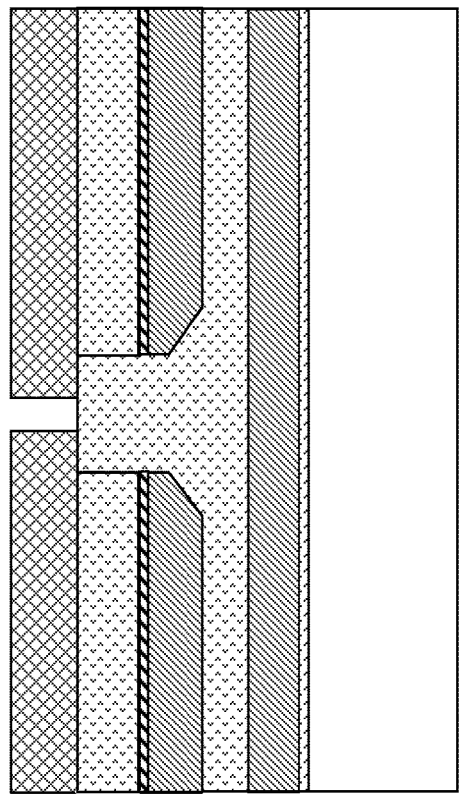
Figure 28A:
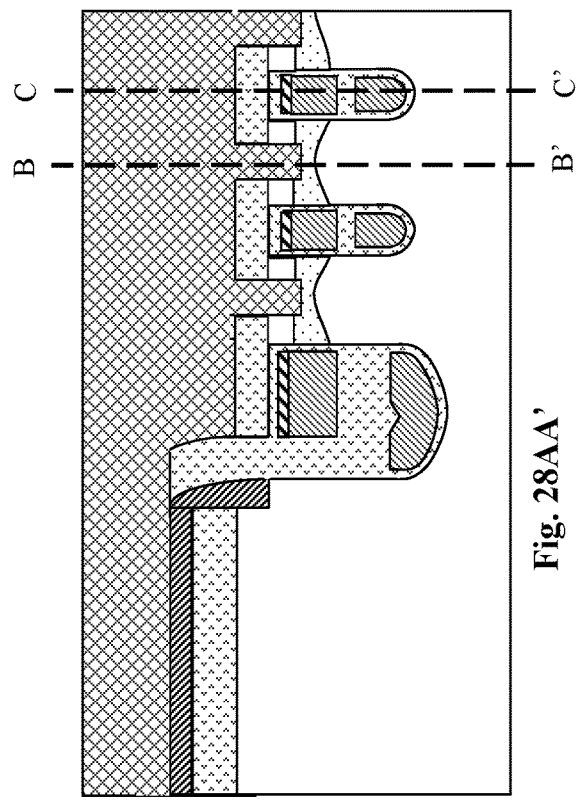
Figure 28L:
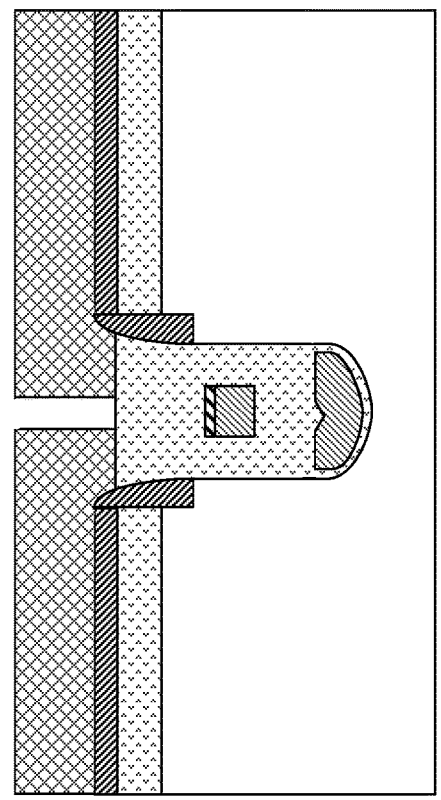

In FIGS. 28AA'-28LL', contact patterns are formed by removing exposed PR. Contact openings are formed over the source poly pickup contact shown in FIGS. 28BB' and 28CC', and the gate poly pickup contact shown in FIG. 28LL'.

Figure 29B:
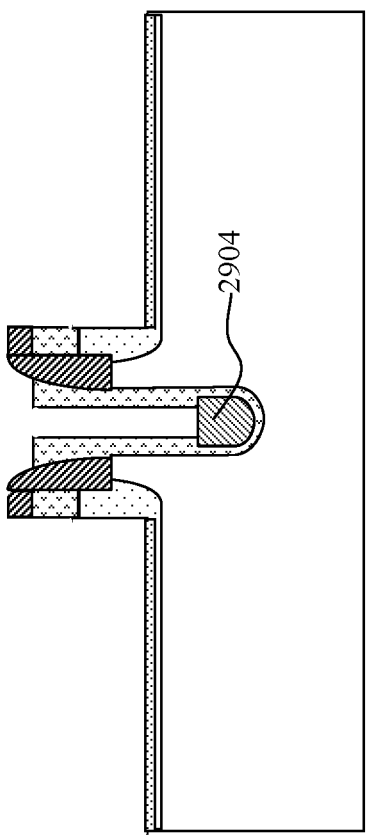
Figure 29C:
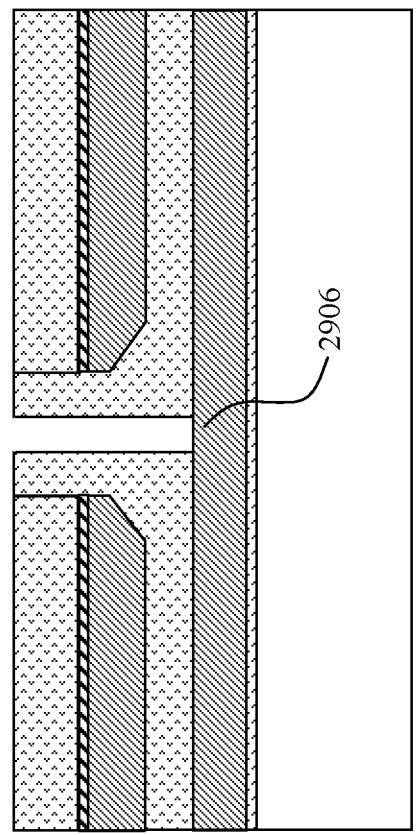
Figure 29A:
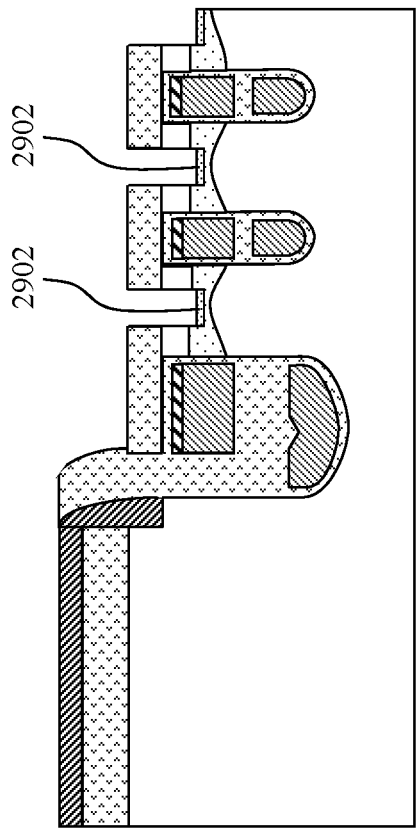
Figure 29L:
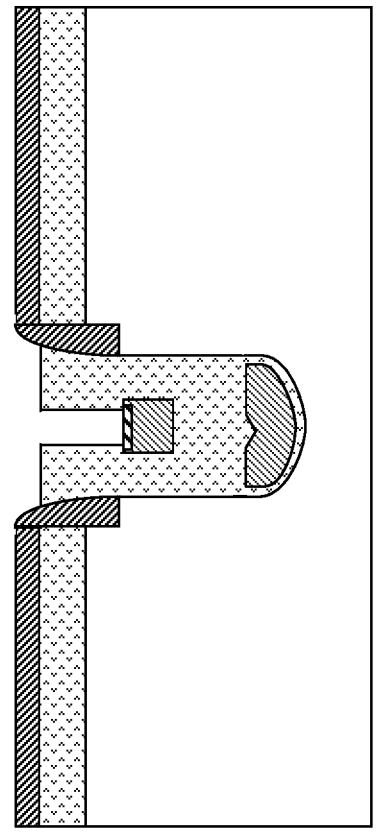

In FIG. 29AA'-29LL', contact etch is performed. PR is then removed. Body contact implant is performed. In this example, P-type material (for example $BF_2$ ions at a dosage level of 1.0e15 at 40 KeV) is used to form body contact implants such 2902. The implantation process is followed by contact implant activation. In some embodiments, the contact implant activation process is a Rapid Thermal Process (RTP) at approximately 1000° C. for 30 seconds. Alternatively, Active Thermal Drive can be used to activate the contact implant. In FIGS. 29BB' and 29CC', source polys such as 2904 and 2906 are unaffected by the implantation since the source polys are already heavily doped with source type dopants.

Figure 30A:
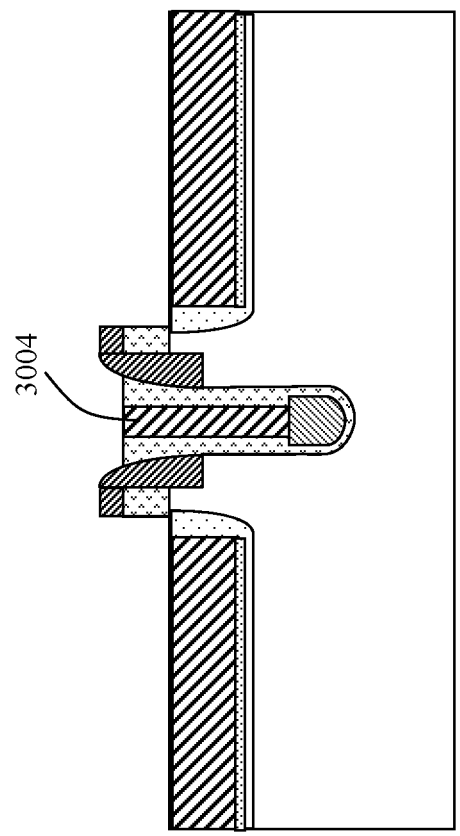
Figure 30B:
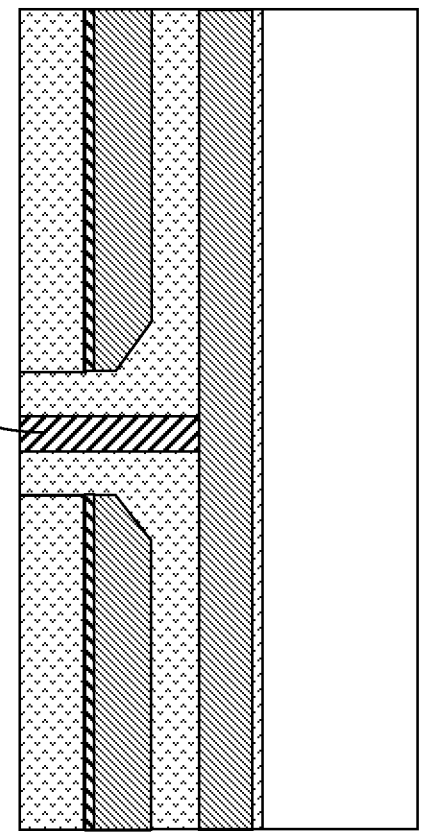
Figure 30L:
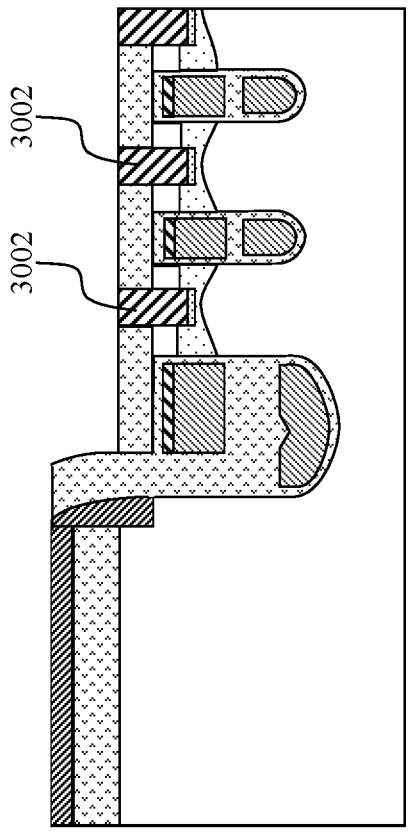
Figure 30C:
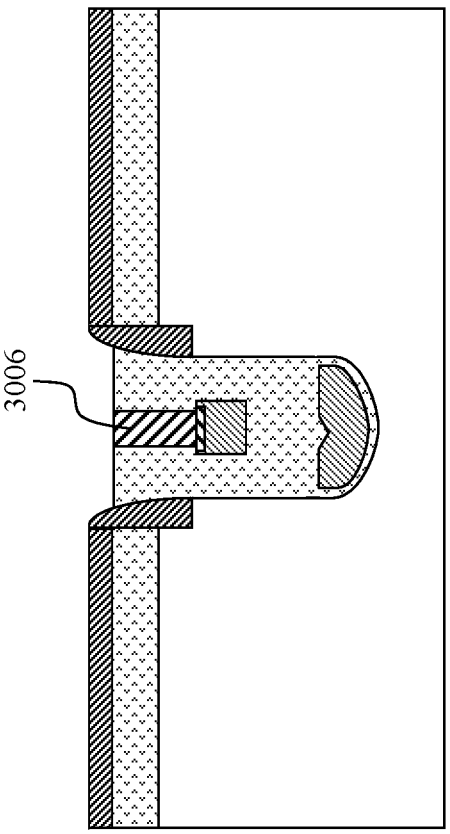

In FIG. 30AA'-30LL', barrier metal such as Ti and TiN are deposited, followed by RTP to form Ti silicide near the contact region. The thicknesses of Ti and TiN used in some embodiments are 300 Å and 1000 Å, respectively. W is then deposited. In some embodiments 4000 Å~6000 Å of W is deposited. The deposited W is etched back up to the oxide surface to form individual W plugs such as 3002, 3004, 3006, and 3008.

A fourth mask is used to form a source metal region and a gate metal region, and to make contacts at the appropriate locations. FIG. 5 is a diagram illustrating an example of a fourth mask, also referred to as a metal mask. Shaded regions 502 and 504 correspond to the source metal and the gate metal, respectively. The un-shaded portion corresponds to metal portion that is etched away to separate the source metal region and the gate metal region.

Figure 31B:
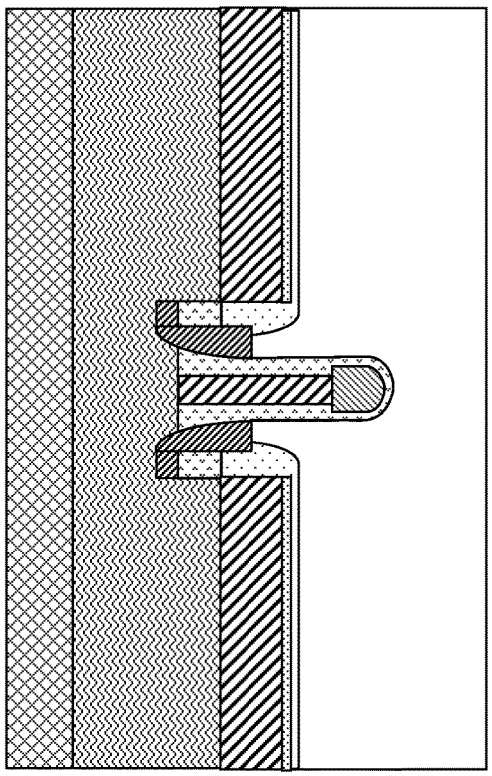
Figure 31C:
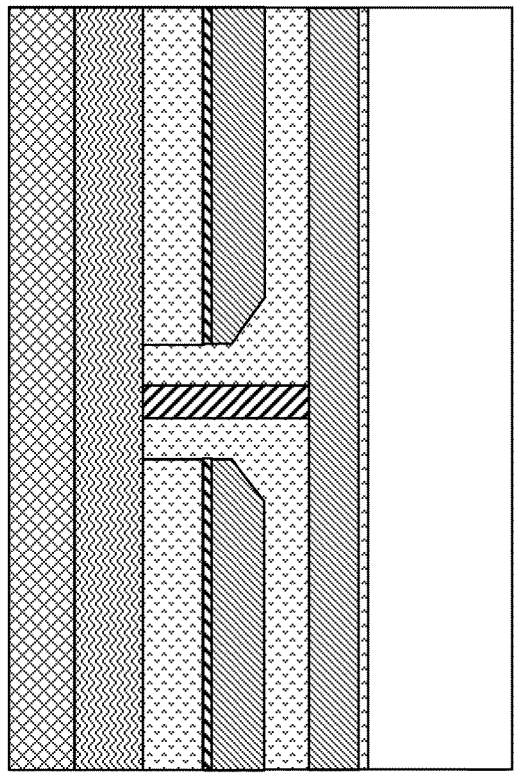
Figure 31A:
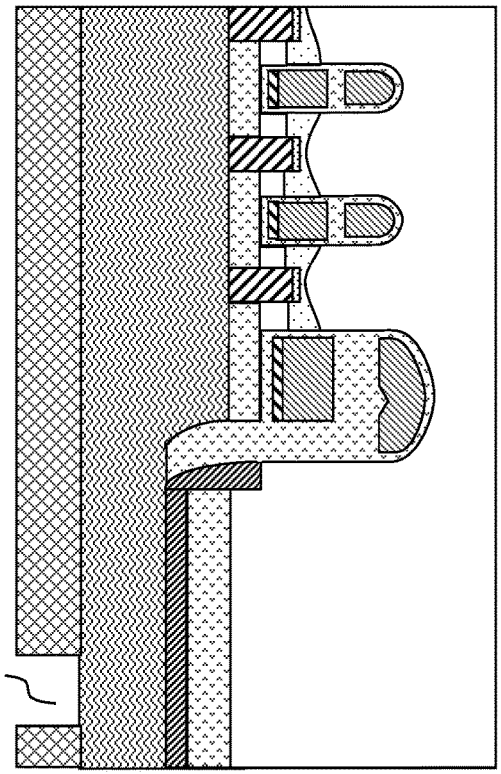
Figure 31L:
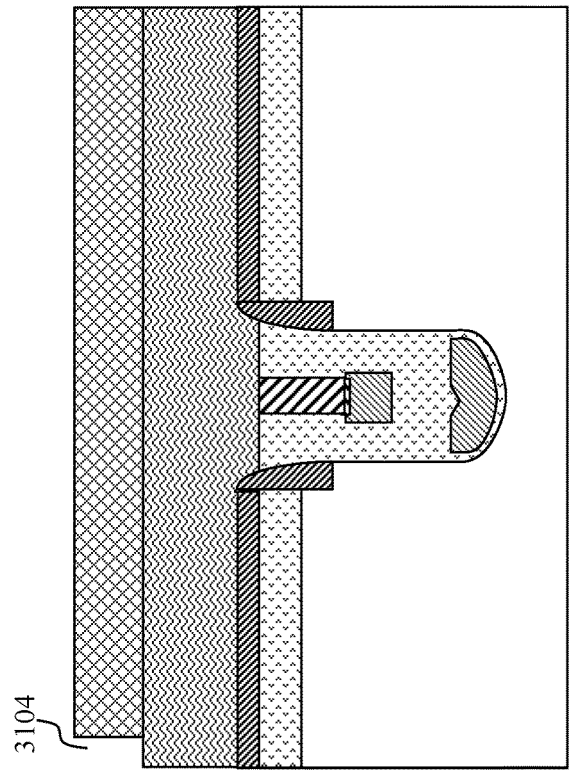

In FIGS. 31AA'-31LL', a metal layer is deposited. In some embodiments, AlCu is used to form a metal layer that is approximately 3 um~6 um thick. PR is then disposed and exposed using the metal mask. Metal in exposed regions such as 3102 and 3104 is etched away.

The residual PR layer is removed, and the metal is annealed. In some embodiments, the metal is annealed at 450° C. for 30 minutes. FIGS. 32AA'-32LL' illustrate cross sectional views of the final device.

Figure 33A:
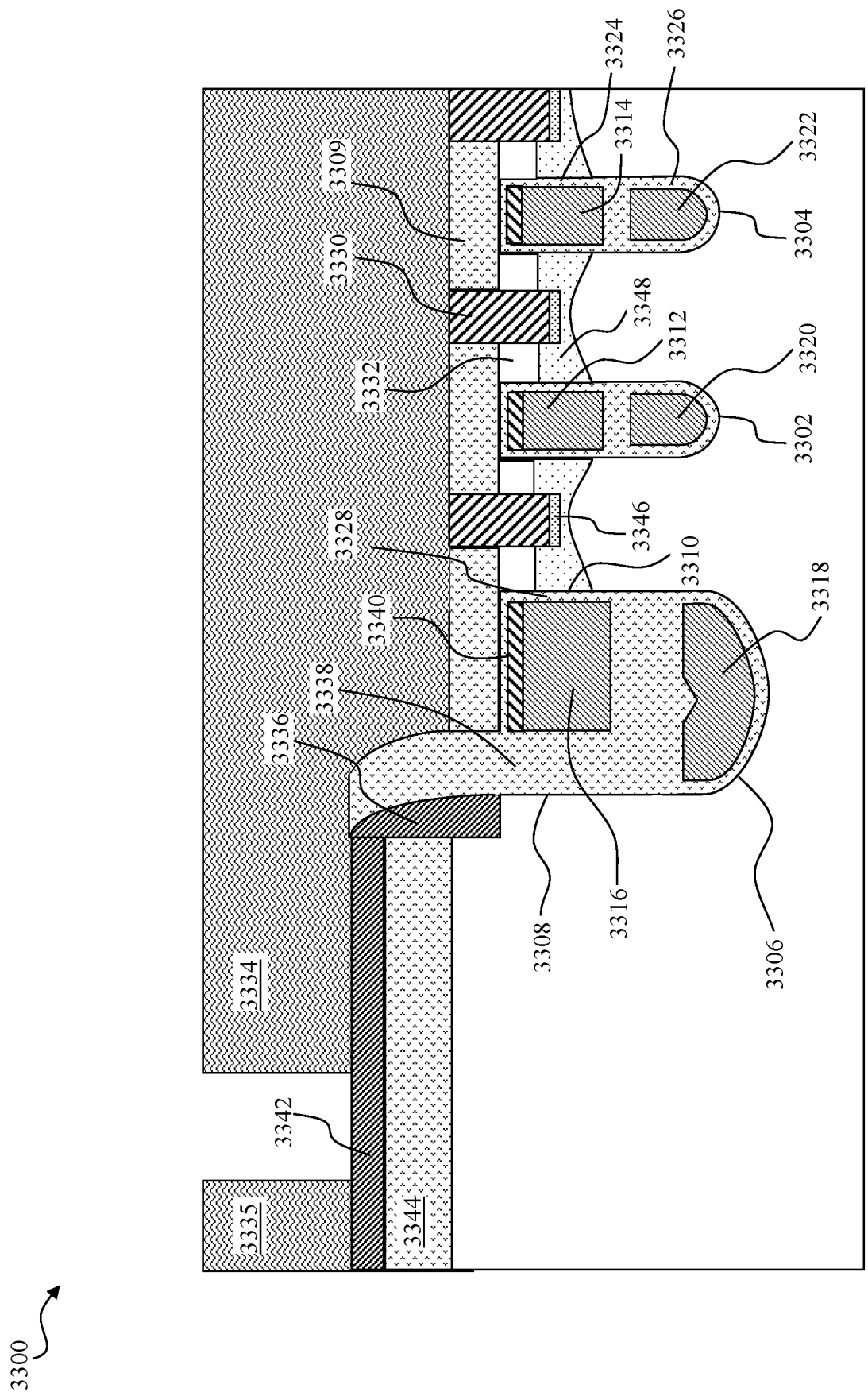
FIG. 33AA' is a cross sectional diagram illustrating the AA' cross section of an example device.

FIG. 33AA' is a cross sectional diagram illustrating the AA' cross section of an example device. In this example, the source, body, and metal regions of the device are shown as labeled. Device 3300 includes an asymmetric trench 3306, and active gate trenches 3302 and 3304. Asymmetric trench 3306 serves as a termination trench separating a high potential area (i.e. the drain) from a low potential area (i.e., the source). In trench 3306, sidewall 3308 is in close proximity to the termination region and sidewall 3310 is in close proximity to the active region. The oxide layer 3338 lining between sidewall 3308 and top gate poly 3316 is thicker than the oxide layer 3328 lining between sidewall 3310 and top gate poly 3316. The thicker oxide layer provides better shielding of low potential areas such as the source from high potential areas such as the drain, and improves the device's breakdown voltage (BV). As will be described in connection with FIG. 33LL', trench 3306 also serves the additional purpose of a gate runner trench that surrounds the active area and interconnects with active gate trenches.

The asymmetric trench and the active gate trenches each include a top poly electrode (e.g., poly 3316, 3312, or 3314), also referred to as the gate poly since it function as the gate, or poly 2 since it is formed from the second poly deposition process during fabrication. Each top poly electrode further includes a polycide layer 3340 disposed on top surface of gate electrode to improve the conductivity along the gate. Each trench further includes a bottom poly electrode (e.g., poly 3318, 3320, and 3322), also referred to as the source poly since it is connected to the source, or poly 1 since it is formed from the first poly deposition process during fabrication, or shield poly since it shields the gate poly from high voltages. The gate poly is separated from the source poly by inter-poly dielectric regions formed by oxide. In the active gate trenches shown in this example, the oxide layer (e.g., oxide layer in region 3324) that surrounds the gate poly and lines the sidewalls of the top portion of the trench is thinner than the oxide layer (e.g. oxide layer 3326) surrounding the source/shield poly and lining the sidewalls of the bottom portion of the trench. Further, oxide layer 3328 is substantially the same thickness as the active gate oxide 3324 as they are formed in the same process. In active area source metal 3334 is insulated from gate electrodes 3312, 3314 and 3316 by a dielectric layer such as oxide 3309. Source metal layer 3334 electrically connects to source regions 3332 and body regions 3348 through a conductor 3330 such as Tungsten plug that fills the source body contact openings and extends from source metal penetrating through the source regions into the body regions. Body contact implant regions 3346 improve the Ohmic contact between the body regions and the conductor 3330. In the termination area, oxide 3338 extends along nitride spacer 3336 to substantially the same top surface of nitride layer 3342. Nitride layer 3342 and nitride spacer 3336 seal the oxide layer 3344 deposited on the top surface of epi layer in termination area. The bottom of oxide layer 3344 or the top surface of epi layer in termination area is substantially aligned with the top surface of oxide layer 3309 in the active area. Further, the bottom of nitride spacer 3336 serves as a reference to align the top surface of source regions 3332. The top surfaces of top poly gate electrodes 3321, 3314 and 3316 are recessed from this reference mark and lie below the top surface of the source regions 3332. Gate metal 3335 disposed on top of nitride layer 3342 is separated from source metal and electrically connects to gate electrode in another location as shown in FIG. 33LL'.

Figure 33B:
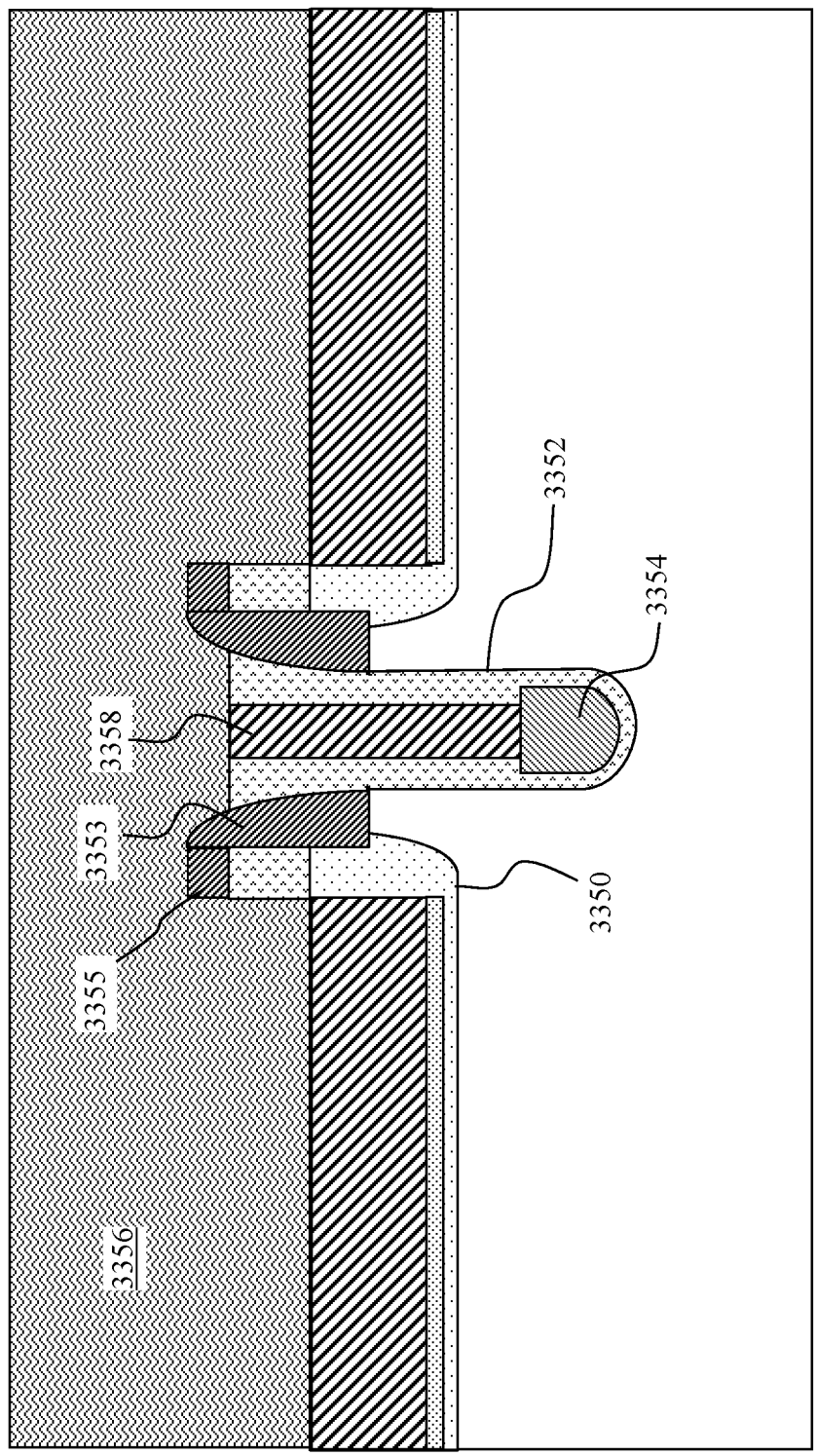
FIG. 33BB' is a cross sectional diagram illustrating the BB' cross section of an example device.

FIG. 33BB' is a cross sectional diagram illustrating the BB' cross section of an example device. In this example, source pickup trench 3352 has a source polysilicon electrode 3354 that is electrically connected to the source metal 3356 via a metal conductor such as a tungsten plug filling a contact hole 3358 within the trench 3352. The contact hole has a width narrower than the polysilicon electrode and extends vertically from the source polysilicon electrode to source metal layer 3356 deposited on top surface. The top surface of the source poly electrode is positioned below the bottom of body region 3350 (body junction). In some embodiments, the source pickup trench 3352 may be wider and deeper than the active gate trenches 3302 and 3304 as shown in FIG. 33AA'. In some other embodiments the source pickup trenches may be narrower and shallower than the active gate trenches. A nitride spacer 3353 disposed in proximity to the top portion of source pickup trench sidewall extending to the top surface of nitride region 3355 blocks body implant therefore separating the body from the sidewall of source pickup trench.

Figure 33C:
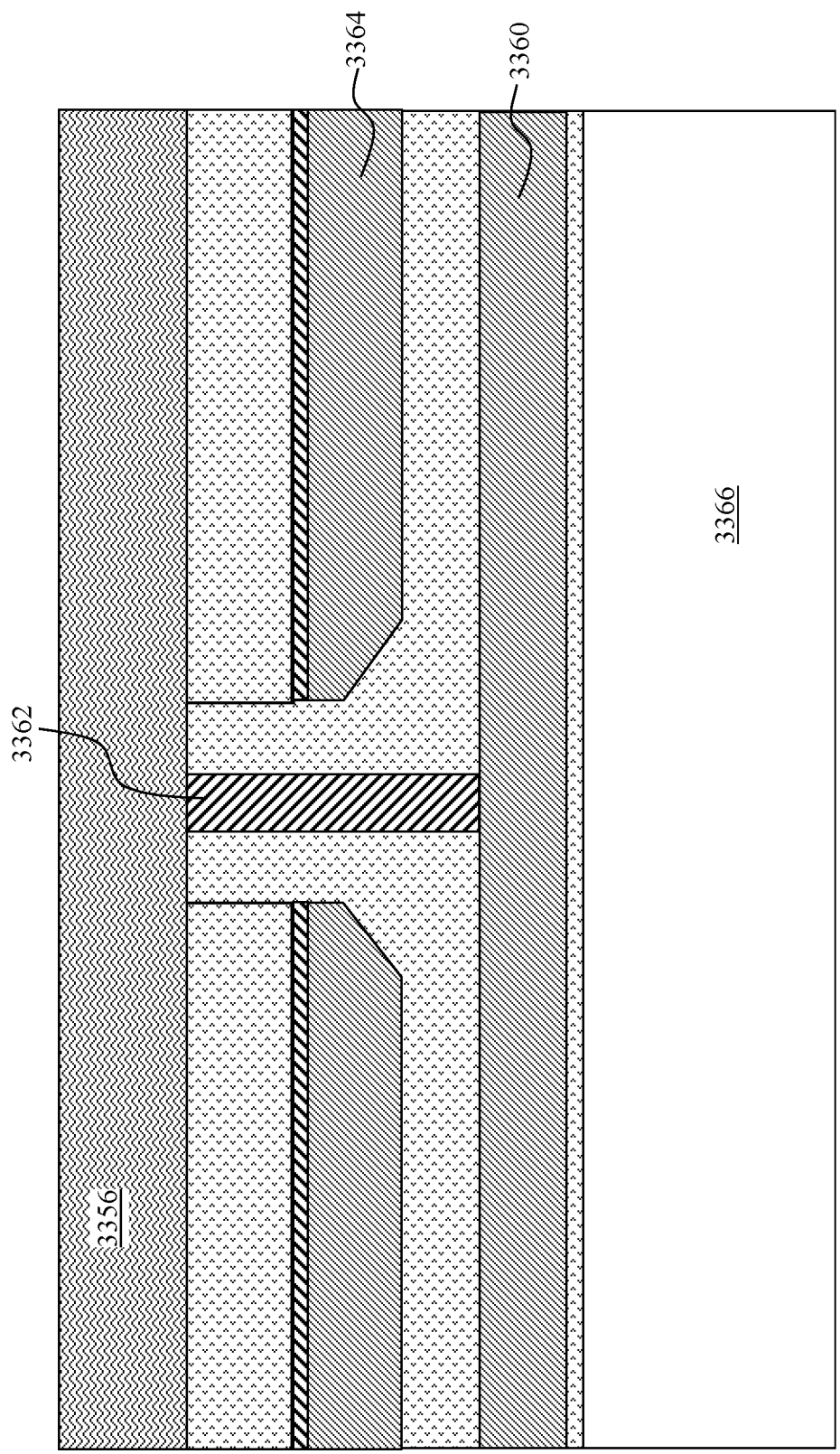
FIG. 33CC' is a cross sectional diagram illustrating the CC' cross section of an example device.

FIG. 33CC' is a cross sectional diagram illustrating the CC' cross section of an example device. As shown in the diagram, source poly 3360 is connected to source metal layer 3356 via tungsten plug 3362, which fills a contact hole opened within the source poly pickup trench and extends from the source polysilicon electrode to source metal layer 3356. The source poly 3360 further extends into a space below the active gate electrodes 3364 along the active gate trenches therefore forming a shield electrode (source/shield poly) to shield the gate electrodes from the drain region 3366 disposed on the semiconductor substrate, which usually connects to high voltage.

Figure 33L:
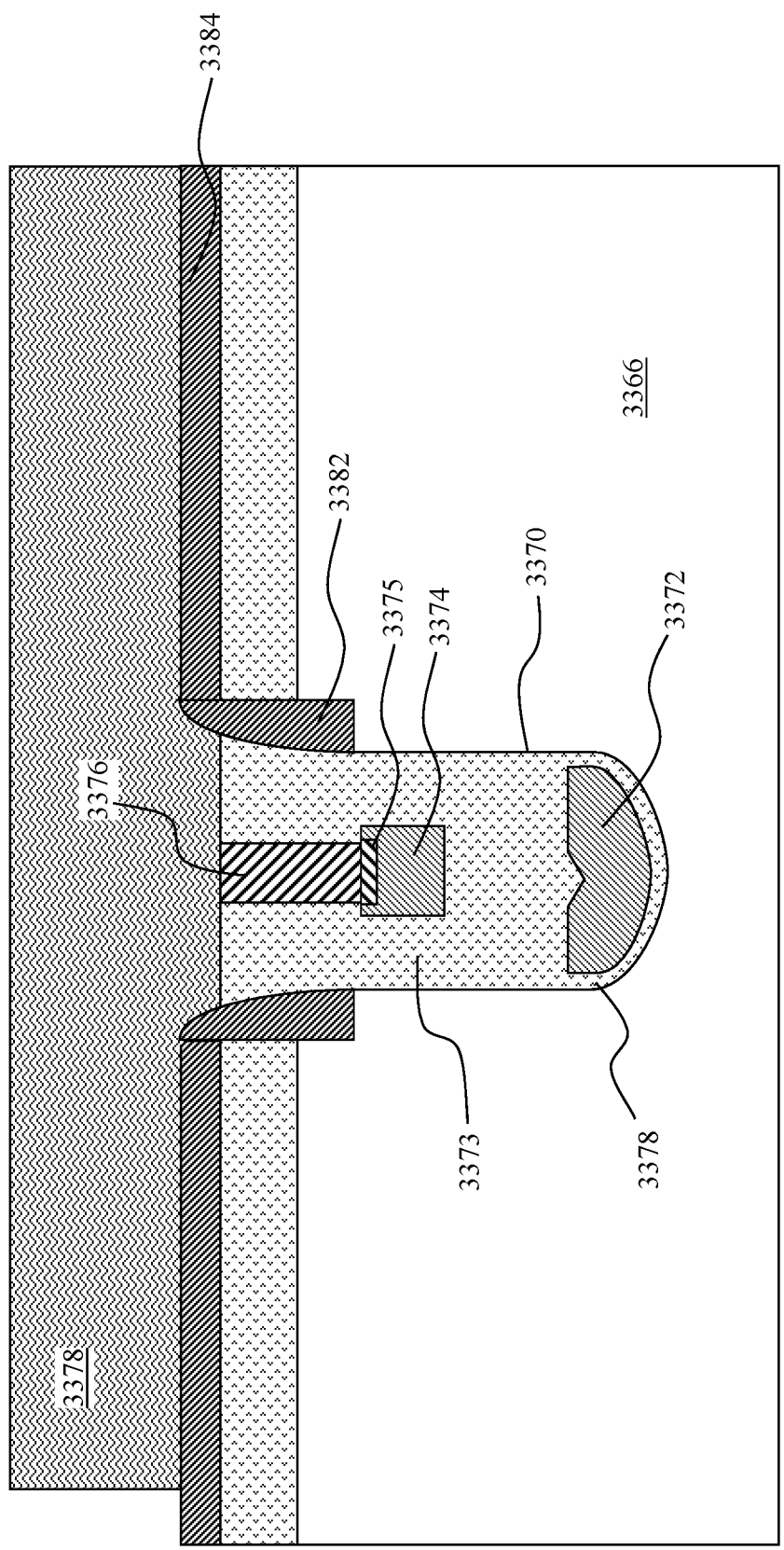
FIG. 33LL' is a cross sectional diagram illustrating the LL' cross section of an example device.

FIG. 33LL' is a cross sectional diagram illustrating the LL" cross section of an example device. Unlike the asymmetric trench 3306 in FIG. 33AA', gate pickup trench 3370 in FIG. 33LL' (which is an extension trench of gate runner trench 3306) exhibits a substantially symmetric structure in reference to the center line of the trench. In this example, source/shield poly 3372 and gate poly 3374 are embedded in gate pickup trench 3370. The thicknesses of oxide layers 3373 disposed between the gate poly 3374 and the sidewalls of the upper portion of the trench is substantially uniform and is substantially thicker than the oxide layers (e.g. oxide layer 3378) surrounding the source/shield poly and lining the both sidewalls of the bottom portion of the trench. The top surface of the gate poly is recessed from the top surface of epi substrate 3366 and has a polycide layer 3375 for improving gate conductivity along the gate trench. A tungsten plug filling a contact hole 3376 opened within the gate pickup trench extends from the top of gate poly to the gate metal layer 3378 deposited on top surface of nitride layer 3384, and electrically connects the gate poly electrode 3374 with gate metal 3378. Nitride spacer 3382 in proximity to the top portion of the gate pickup trench sidewall extends to the top surface of nitride layer 3384. Nitride layer 3384 and nitride spacer 3382 seal the oxide layer 3386 deposited on the top surface of epi substrate in termination area. The top surface of gate electrode 3374 lies below the bottom of nitride spacer 3382. Gate pickup trench 3370 is wider than the active gate trench.

Figure 34:
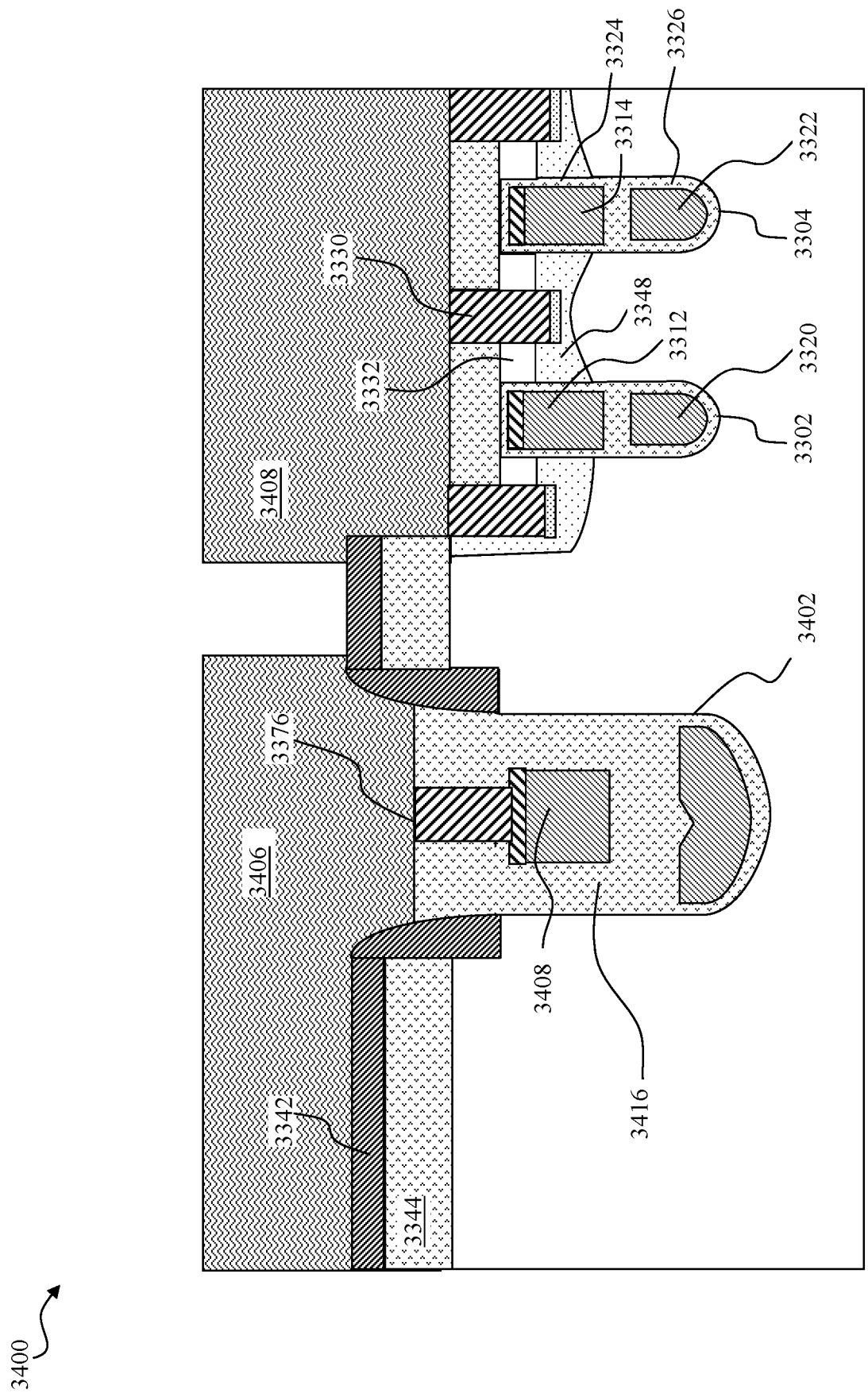
FIG. 34 is a cross sectional diagram illustrating the AA' cross section of another embodiment of a device.
Figure 35:
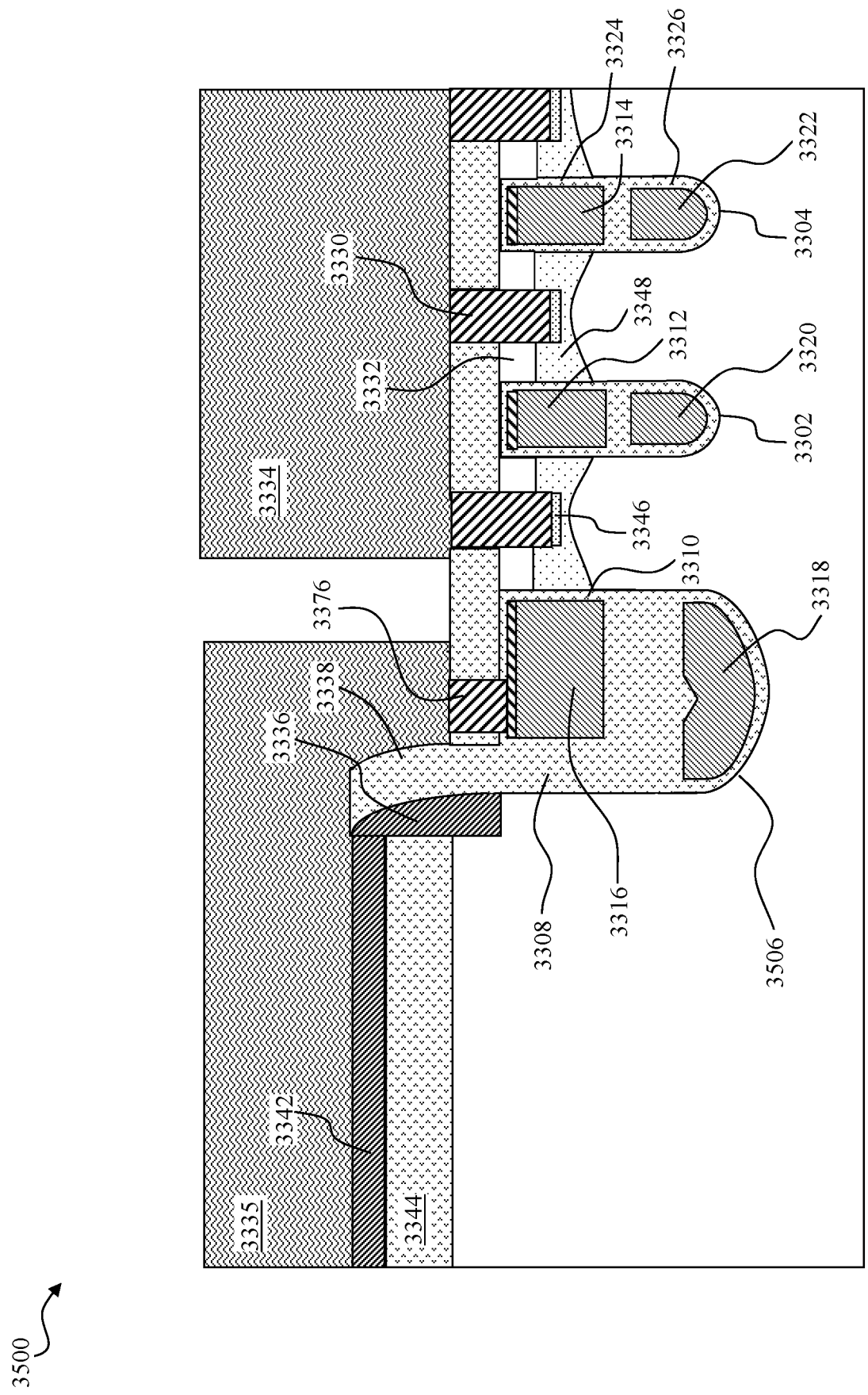
FIG. 35 is a cross sectional diagram illustrating the AA' cross section of yet another embodiment of a device.

The above embodiment provides a MOSFET device with a gate runner trench having an asymmetric structure in some sections (such as AA') and a substantially symmetric structure in other sections (such as LL'). Depending on the mask design, alternative embodiments may be produced following the same process. In one alternative embodiment, the second mask as shown in FIG. 18AA' extends over into the active area at 1806 to such a distance that the PR completely protects the oxides lining both sidewalls of trench 1804 from etch in the following wet etch process, in a way similar to that shown in FIGS. 18LL' and 19LL', the resulting device structure following the process as previously described is a device 3400 shown in FIG. 34, with a termination/gate runner trench 3402 having a substantially symmetric structure similar to that of FIG. 33LL' rather than the asymmetric structure of FIG. 33AA'. Alternatively gate contact opening 3376 may be formed directly above the termination/gate runner trench 3402 in AA' cross section by rearrange the gate contact location in the third mask, so that the termination/gate runner trench 3402 also functions as the gate pickup trench. In some embodiments, the first mask and the fourth mask are modified such that the distance between the termination/gate runner trench 3402 and the active gate trench 3302 next to termination area is increased to have enough space to separate gate metal 3406 from source metal 3408. In some other embodiments, gate contact hole may be disposed on top of asymmetric termination/gate runner trench to directly pick up gate contact to the gate metal. The termination/gate runner trench, therefore, also serves as gate pickup trench. As shown in FIG. 35, device 3500 has a similar structure as device 3300 in FIG. 33AA', except a gate contact hole 3376 is disposed on top of asymmetric termination/gate runner trench 3506, and the gate and source metals are separated in an appropriate location to facilitate the gate contact.

The above examples mostly illustrate N-type devices. The techniques described are also applicable to P-type devices, in which polarities of various dopants are reversed.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A semiconductor device, comprising:
a substrate;
an active gate trench in the substrate;
a source polysilicon pickup trench in the substrate;
a polysilicon electrode disposed in the source polysilicon pickup trench;
a gate pickup trench in the substrate;

a first conductive region and a second conductive region disposed in the gate pickup trench, the first conductive region and the second conductive region being separated by oxide, wherein:
  oxide surrounding a side wall of the first conductive region in the gate pickup trench is thicker than oxide surrounding a side wall of the second conductive region; and
  the first conductive region is above the second conductive region; and
a body region in the substrate.

2. The semiconductor device of claim 1, further comprising a contact hole filled with a metal conductor extending from the polysilicon electrode to a source metal layer deposited on a top side of the semiconductor device.

3. The semiconductor device of claim 2, wherein the contact hole is narrower in width than the polysilicon electrode.

4. The semiconductor device of claim 1, wherein the source polysilicon pickup trench is deeper than the active gate trench.

5. The semiconductor device of claim 1, wherein the source polysilicon pickup trench is narrower than the active gate trench.

6. The semiconductor device of claim 1, wherein the first conductive region includes a gate polysilicon region.

7. The semiconductor device of claim 1, wherein the second conductive region includes a source/shield polysilicon region.

* * * * *